(12) United States Patent
Gellrich et al.

(10) Patent No.: US 7,545,483 B2
(45) Date of Patent: Jun. 9, 2009

(54) OPTICAL ELEMENT UNIT FOR EXPOSURE PROCESSES

(75) Inventors: Bernhard Gellrich, Aalen (DE); Jens Kugler, Aalen (DE); Thomas Schletterer, Stadtroda (DE); Guido Limbach, Aalen (DE); Julian Kaller, Koenigsbronn (DE); Hans-Juergen Scherle, Aalen (DE); Detlev Mueller, Ellwangen (DE); Dieter Schmerek, Huettlingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 12/008,879

(22) Filed: Jan. 15, 2008

(65) Prior Publication Data

US 2008/0192215 A1 Aug. 14, 2008

Related U.S. Application Data

(63) Continuation of application No. 11/578,451, filed as application No. PCT/EP2005/003875 on Apr. 13, 2005, now abandoned.

(30) Foreign Application Priority Data

Apr. 13, 2004 (DE) .................. 10 2004 018 659

(51) Int. Cl.
*G03B 27/54* (2006.01)
(52) U.S. Cl. .................. 355/67; 355/71; 378/34
(58) Field of Classification Search .......... 355/67, 355/71; 378/34, 35; 250/492.2
See application file for complete search history.

(56) References Cited

U.S. PATENT DOCUMENTS

2002/0027725 A1* 3/2002 Schletterer .................. 359/811

FOREIGN PATENT DOCUMENTS

EP          1 339 099 A     8/2003
WO     WO 02/065183         8/2002

OTHER PUBLICATIONS

International Search Report based on PCT/EP2005/003875 dated May 12, 2006.
Written Opinion based on PCT/EP2005/003875 dated May 12, 2006.

* cited by examiner

*Primary Examiner*—D. Rutledge
(74) *Attorney, Agent, or Firm*—Ohlandt, Greeley, Ruggiero & Perle, L.L.P.

(57) ABSTRACT

An optical element unit is provided comprising an optical element group; a housing receiving said optical element group and having an inner housing part and an exit end; and a purge unit connected to said housing and providing a purge medium to said inner housing part. The optical element group comprises an ultimate optical element. The ultimate optical element is located at the exit end of housing and separates the inner housing part from an environment external to the housing. The ultimate optical element and the housing define a sealing gap. The purge unit provides purge medium to the sealing gap to prevent intrusion of contaminants into the inner housing part.

82 Claims, 8 Drawing Sheets

OPTICAL ELEMENT UNIT FOR EXPOSURE PROCESSES

BACKGROUND OF THE INVENTION

The present invention relates to optical element units for exposure processes, in particular exposure processes using immersion techniques, and, in particular, to optical element units of microlithography systems using immersion techniques. It also relates to optical exposure apparatuses comprising such an optical element unit. Furthermore, it relates to a method of preventing intrusion of contaminants into an optical element unit as well as a method of holding an ultimate optical element of an optical element unit. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical elements, such as lenses and mirrors etc., in the light path of the optical system. Those optical elements usually cooperate in an exposure process to transfer an image formed on a mask, reticle or the like onto a substrate such as a wafer. Said optical elements are usually combined in one or more functionally-distinct optical element groups. These distinct optical element groups may be held by distinct optical element units.

Optical element groups comprising at least mainly refractive optical elements, such as lenses, mostly have a straight common axis of symmetry of the optical elements usually referred to as the optical axis. Moreover, the optical element units holding such optical element groups often have an elongated substantially tubular design due to which they are typically referred to as lens barrels.

Due to the ongoing miniaturization of semiconductor devices there is a permanent need for enhanced resolution of the optical systems used for fabricating those semiconductor devices. This need for enhanced resolution obviously pushes the need for an increased numerical aperture and increased imaging accuracy of the optical system. Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system.

To increase the numerical aperture so called immersion techniques have been proposed in the context of microlithography systems. With such immersion techniques, the last optical element of the optical system located closest to the substrate is immersed in an immersion medium, usually highly purified water, which is provided in an immersion zone on the substrate. With these immersion techniques numerical apertures NA>1 may be obtained.

This immersion of the last optical element causes several problems. One problem lies within the fact that the rest of the optical system usually has to be protected against any contact with the immersion medium, fractions thereof or reaction products thereof to avoid contamination of the optical elements with such contaminants. Such contaminants would otherwise lead to an undesirable degradation of the optical performance of the optical system. Thus, usually, the contact surfaces between the last optical element and the housing of the optical element holding said last optical element are sealed to avoid any intrusion of contaminants into the interior of the housing.

Usually, this sealing of the contact surfaces is achieved by gluing the last optical element to the housing, the glue forming a tight seal of the contact surfaces. Anyway, this gluing brings along several disadvantages. One of them is the fact that, due to different coefficients of thermal expansion of the last optical element and the housing, the glue seal is subjected to varying stresses during operation. These varying stresses, of course, may have adverse effects on the useful life of the glue seal.

Furthermore, the glue itself may be a source of contaminants leading to a contamination of the optical elements and, consequently, to an undesirable degradation of the optical performance of the optical system.

A further problem lies within the deformation of the last lens element due to different coefficients of thermal expansion of the last optical element and the housing. These deformations have a considerably stronger influence on the imaging quality than in conventional "dry" exposure processes without an immersion medium. In conventional "dry" exposure processes with air or gas being present at both sides of the last optical element, compensation effects occur upon deformation of the last optical element due to the approximately identical refractory index ratios on both sides of the last optical element. Since the refractory index of the immersion medium is similar to the refractory index of the last optical element, these compensation effects do not occur. Thus, such thermally induced deformations of the last optical element are to be avoided to the greatest possible extent.

A solution would be to provide a housing that has a coefficient of thermal expansion that is comparable to the coefficient of thermal expansion of the last optical element. Anyway, such a housing would be rather expensive.

The problem of the intrusion of parts of the external atmosphere into the interior of the housing of the optical system used in the exposure process does not only exist for optical exposure systems using immersion techniques. For example, when using light in the so called vacuum ultraviolet range for a conventional "dry" exposure process, the light of this range is strongly absorbed by a large variety of substances such as oxygen, water vapor etc. Thus, it is necessary to provide a low absorption atmosphere throughout the entire path of the light to maintain the exposure performance of the system. Thus, sometimes, a low absorption gas such as nitrogen is used as the atmosphere surrounding the housing of the optical system while, e.g. for thermal reasons, a low absorption gas such as is used as the medium within the housing. Since the refractory index of nitrogen considerably deviates from the refractory index of helium, it is necessary to prevent intrusion of the nitrogen into the housing of the optical system in order to maintain stable imaging properties of the optical system within the housing.

To avoid such contamination of the inner part of the housing of the optical system it is known from EP 1 339 099 A1 to Shiraishi to provide a long and narrow axial gap between an ultimate optical element and the housing of the optical system and to draw off sub-stances entering the gap via an exhaust channel open towards the gap. The gap is provided via three conical posts protruding from the housing on which the ultimate optical element is sitting. The ultimate optical element is axially clamped between the housing and a clamping ring. The clamping ring contacts the ultimate optical element via three conical posts protruding from the clamping ring and being axially aligned with the corresponding conical posts protruding from the housing.

This solution, on the one hand, has the disadvantage that, due to the drawing off process in the gap, the pressure within the housing may drop considerably leading to an unwanted deformation of the ultimate optical elements. A further disadvantage lies within the fact that the gap width is defined by the fixed dimensions of the posts such that an adjustment of the gap width is not possible. Furthermore, again, the differences in the coefficient of thermal expansion between the ultimate optical element lead to the introduction of deformations into the ultimate optical element clamped between the housing and the clamping ring.

SUMMARY OF THE INVENTION

It is thus an object of the present invention to, at least to some extent, overcome the above disadvantages and to provide good and long term reliable imaging properties of an optical system, in particular of an optical system used in an immersion exposure process.

It is a further object of the present invention to easily and reliably prevent intrusion of contaminants into the inner part of an optical element unit in order to maximize the useful life without maintenance of the optical system within an optical element unit, in particular an optical element unit used in an immersion exposure process.

It is a further object of the present invention to hold the optical element separating the inner part of an optical element unit from an outer environment in a simple and deformation minimized manner in order to provide good and reliable imaging properties of the optical system, in particular of an optical system used in an immersion exposure process.

These objects are achieved according to the present invention which is based on the teaching that good and long term reliable imaging properties may be achieved when the ultimate optical element is directly held by the housing of the optical element unit in such a manner that an open sealing gap is adjustably formed between the optical element and the housing.

This configuration, on the one hand, allows for a simple implementation of a thermal expansion compensation mechanism. Such a thermal expansion compensation mechanism may provide for a compensation of differences in the thermal expansion of the optical element and the housing. Such a compensation, in turn, leads to reduced deformation of the optical element and, consequently, to improved imaging properties. In particular, with such a compensation mechanism, there is no need for expensive solutions trying to match the thermal expansion coefficients of the optical element and the housing. Such a thermal expansion compensation mechanism may be located at any suitable location at or near the interface between the optical element and the housing.

This configuration, on the other hand, also allows for a simple implementation of a sealing mechanism preventing intrusion of contaminants into the housing of the optical element unit to be immersed. This sealing mechanism according to the present invention provides for a sealing fluid barrier within said adjustable sealing gap. Such an adjustable configuration with a sealing fluid barrier has the advantage that it allows for essentially unrestricted relative movement between the optical element and the housing while, itself, remaining stable and completely functional. This relative movement may occur essentially without imposing any constraints on the optical element leading to reduced deformation of the optical element and, consequently, to improved imaging properties. Furthermore, the sealing fluid itself may easily be chosen such that it is no source of any contaminants that might lead to imaging quality degradation.

Thus, according to a first aspect of the present invention there is provided an optical element unit comprising an optical element group, a housing receiving said optical element group and having an inner housing part and an exit end, and a purge unit connected to said housing and providing a purge medium to said inner housing part. Said optical element group comprises an ultimate optical element. Said ultimate optical element is located at said exit end of said housing and separates said inner housing part from an environment external to said housing. Said ultimate optical element and said housing adjustably define a sealing gap. Said purge unit provides said purge medium to said sealing gap to prevent intrusion of contaminants into said inner housing part.

According to a second aspect of the present invention there is provided an optical exposure apparatus for transferring an image of a pattern formed on a mask onto a substrate comprising a light path, a mask location located within said light path and receiving said mask, a substrate location located at an end of said light path and receiving said substrate, an optical element unit according to the first aspect of the present invention located within said light path between said mask location and said and said substrate location, and an immersion zone filled with an immersion medium and located within said light path between said optical element unit and said substrate location. Said ultimate optical element separates said inner housing part from said immersion zone. Said purge unit provides said purge medium to said sealing gap to prevent intrusion of said immersion medium through said sealing gap into said inner housing part.

According to a third aspect of the present invention there is provided an optical element unit comprising an optical element and a housing having an inner housing part and an exit end. Said housing holds said optical element at said exit end to separate said inner housing part from an environment external to said housing. Said optical element and said housing define a sealing gap adapted to receive a sealing fluid barrier preventing intrusion of contaminants into said inner housing part.

According to a fourth aspect of the present invention there is provided an optical exposure apparatus for transferring an image of a pattern formed on a mask onto a substrate comprising a light path, a mask location located within said light path and receiving said mask, a substrate location located at an end of said light path and receiving said substrate, an optical element unit according to the third aspect of the present invention located within said light path between said mask location and said and said substrate location, and an immersion zone filled with an immersion medium and located within said light path between said optical element unit and said substrate location. Said optical element separates said inner housing part from said immersion zone. Said sealing fluid barrier is maintained within said sealing gap to prevent intrusion of said immersion medium through said sealing gap into said inner housing part.

According to a fifth aspect of the present invention there is provided an optical element unit comprising an optical element and a housing having an inner housing part and an exit end. Said housing holds said optical element at said exit end to separate said inner housing part from an immersion zone filled with an immersion medium said exit end is to be immersed in. Said optical element and said housing adjustably define a narrow sealing gap, said sealing gap being open towards said immersion zone and said inner housing part.

According to a sixth aspect of the present invention there is provided an optical exposure apparatus for transferring an image of a pattern formed on a mask onto a substrate comprising a light path, a mask location located within said light path and receiving said mask, a substrate location located at an end of said light path and receiving said substrate, an optical element unit according to the fifth aspect of the present invention located within said light path between said mask location and said and said substrate location, and an immersion zone filled with an immersion medium and located within said light path between said optical element unit and said substrate location. Said optical element is immersed within said immersion medium of said immersion zone.

According to a seventh aspect of the present invention there is provided a method of preventing intrusion of contaminants into an optical element unit comprising providing an optical element unit, said optical element unit comprising a housing having an inner housing part and an exit end, providing an optical element at said exit end to separate said inner housing part from an environment external to said housing, said optical element and said housing adjustably defining a sealing gap, and providing a sealing fluid barrier within said sealing gap preventing intrusion of contaminants into said inner housing part.

According to an eighth aspect of the present invention there is provided a method of holding a ultimate optical element of an optical element unit to separate an inner part of said optical element unit from an immersion zone filled with an immersion medium said optical element is to be at least partly immersed in, comprising providing said optical element unit, said optical element unit comprising a housing having an inner housing part and an exit end, holding said optical element at said exit end to separate said inner housing part from said immersion medium. Said optical element is held such that said optical element and said housing adjustably define a narrow sealing gap, said sealing gap being open towards said immersion zone and said inner housing part.

Further embodiments of the present invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

First Embodiment

Figure 1:
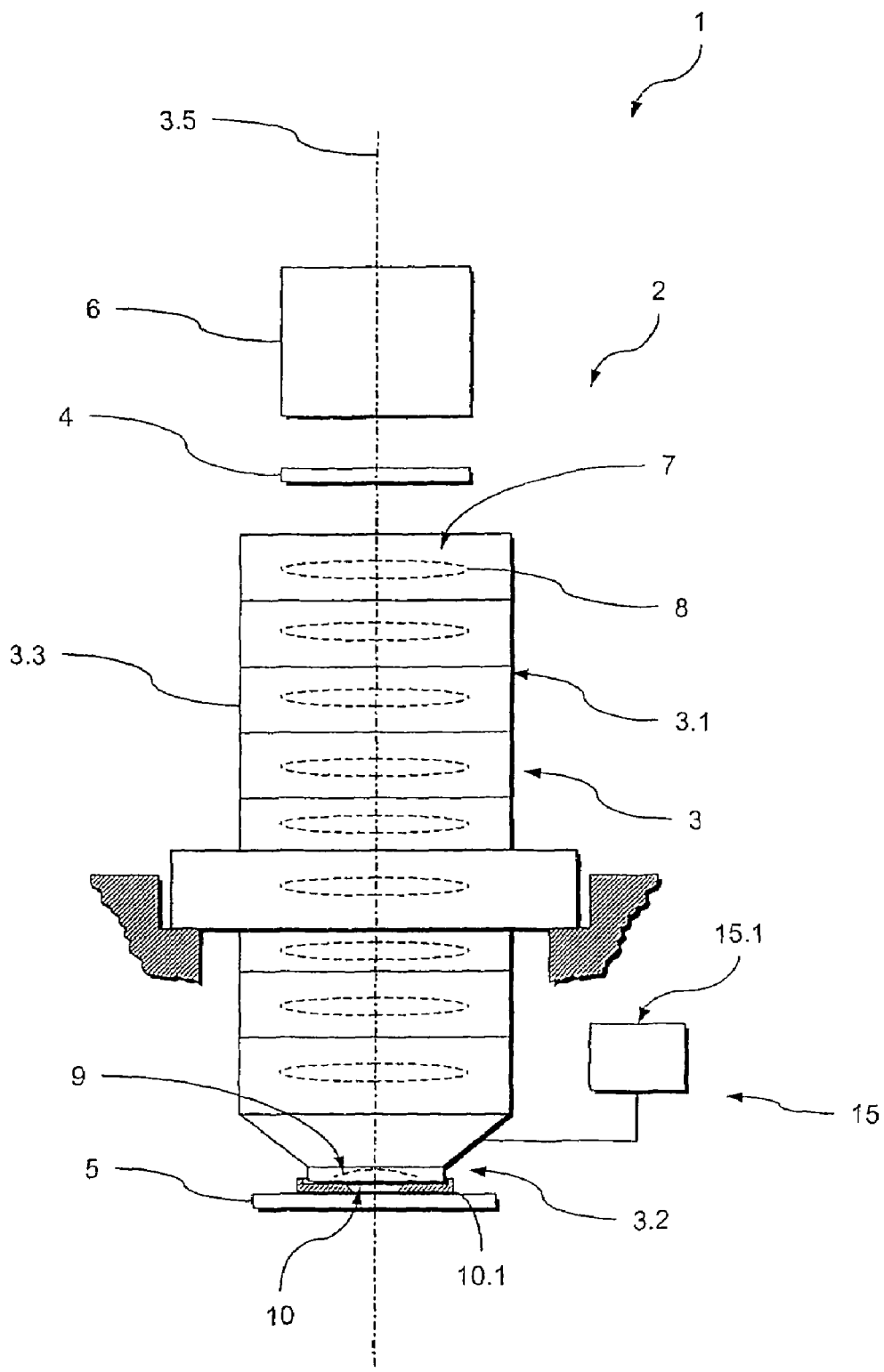
FIG. 1 is a schematic representation of a preferred embodiment of an optical exposure apparatus according to the present invention comprising a preferred embodiment of an optical element unit according to the present invention.

In the following, a first preferred embodiment of an optical exposure apparatus 1 according to the present invention comprising an optical projection system 2 with an optical element unit 3 according to the present invention will be described with reference to FIGS. 1 to 3.

The optical exposure apparatus 1 is adapted to transfer an image of a pattern formed on a mask 4 onto a substrate 5. To this end, the optical exposure apparatus 1 comprises an illumination system 6 illuminating said mask 4 and the optical element unit 3. The optical element unit 3 projects the image of the pattern formed on the mask 4 onto the substrate 5, e.g. a wafer or the like.

To this end, the optical element unit 3 holds an optical element group 7. This optical element group 7 is held within a housing 3.1 of the optical element unit 3. The optical element group 7 comprises a number of optical elements 8, such as lenses, mirrors or the like, and an ultimate optical element in the form of a last optical element 9 located at an exit end 3.2 of the housing 3.1 adjacent to the substrate 5.

The housing 3.1 is composed of a plurality of housing modules 3.3 stacked and tightly connected to form the optical element unit 3. Each housing module 3.3 holds one or more of the optical elements 8 and 9. The mechanical interfaces of the housing modules 3.3 are sealed to prevent intrusion of contaminants into the inner part 3.4 of the housing 3.1 which might otherwise contaminate and affect the optical elements 8, 9 and lead to a degradation of the imaging properties of the optical element group 7.

The optical projection system 2 receives the part of the light path between the mask 4 and the substrate 5. Its optical elements 8 and 9 cooperate to transfer the image of the pattern formed on the mask 4 onto the substrate 5 located at the end of the light path. To increase the numerical aperture NA of the optical projection system 2, the optical projection system 2 further comprises an immersion zone 10 filled with an immersion medium 11 such as highly purified water.

A part of the exit end 3.2 of the housing 3.1 is immersed in the immersion medium 11 such that the immersion zone 10 is mainly defined by the substrate 5, an immersion frame 10.1 located above the substrate 5 and the last optical element 9. The last optical element 9 thus separates the inner part 3.4 of the housing 3.1 from the environment external to said housing 3.1. In particular, the last optical element 9 separates the inner part 3.4 of the housing 3.1 from the immersion medium 11 present within the immersion zone 11.

The last optical element 9 is held by the housing 3.1 such that a narrow circumferential sealing gap 12 is adjustably formed and defined between the last optical element 9 and the housing 3.1. This sealing gap 12 extends in a circumferential direction along the circumference of the last optical element 9.

Figure 2:
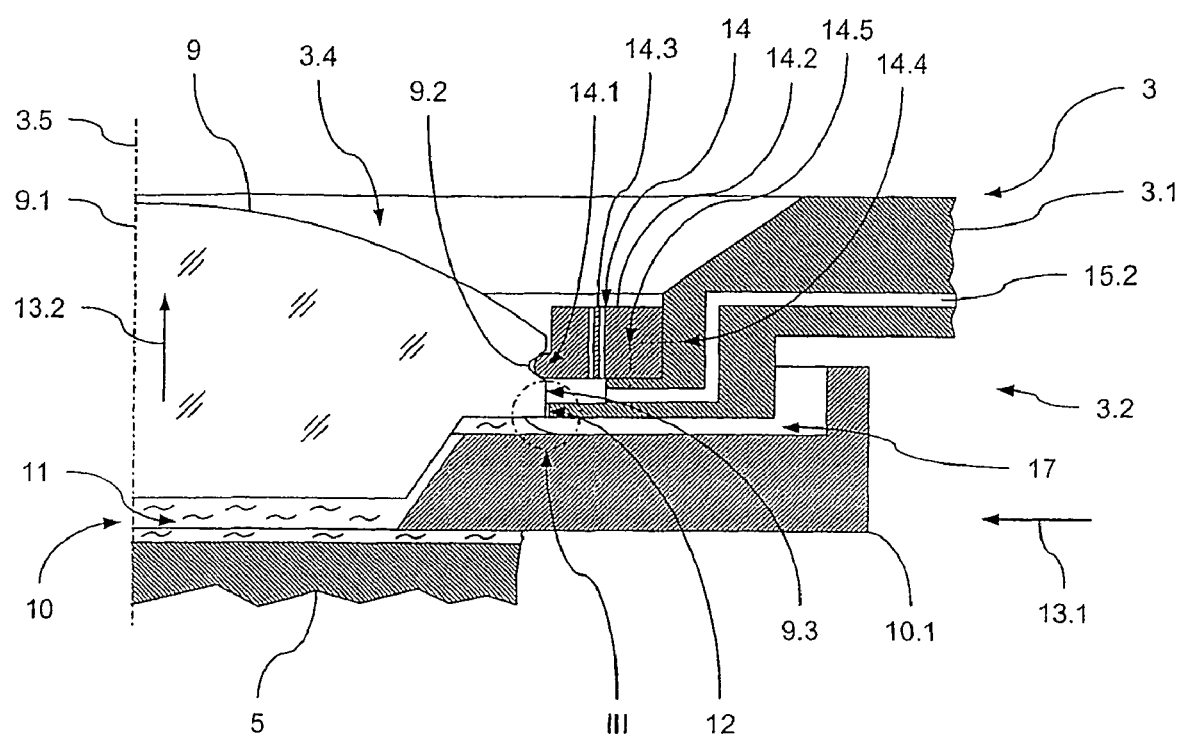
FIG. 2 is a schematic partial representation of the optical element unit of FIG. 1.
Figure 3:
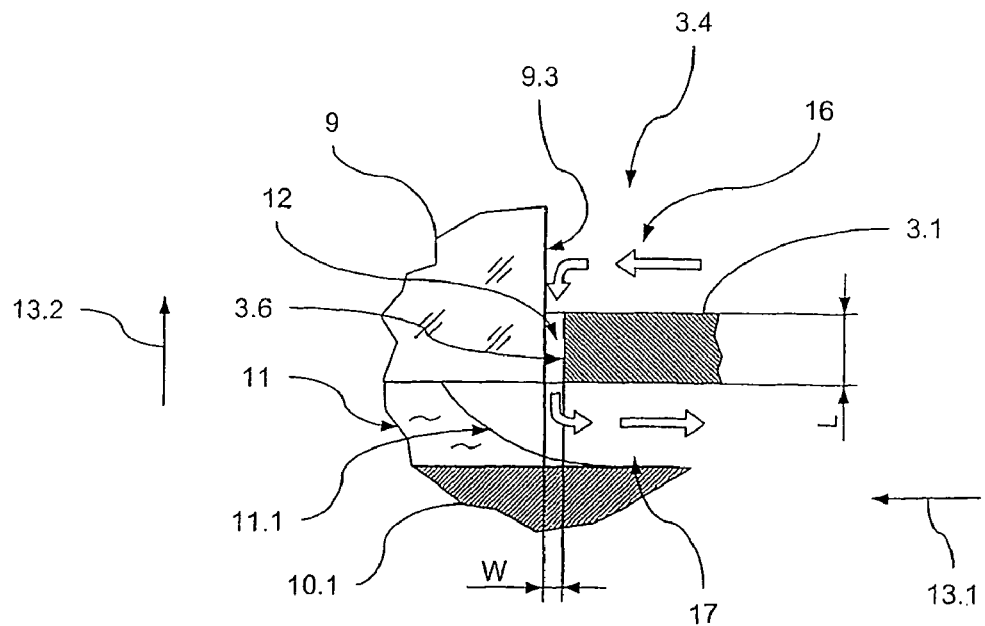
FIG. 3 is a schematic representation of the detail III of FIG. 2.

In a first sectional plane perpendicular to said circumferential direction, i.e. in a plane coinciding with the plane of FIGS. 2 and 3, the sealing gap 12 forms a passageway between the inner part 3.4 of the housing 3.1 and the environment external to the housing 3.1. The sealing gap 12 has a sealing gap width W transverse to said passageway, i.e. in a first direction 13.1, and a sealing gap length L along said passageway, i.e. in a second direction 13.2. The sealing gap width is defined by the distance between the last optical element 9 and the housing 3.1 in the sealing gap 12.

The sealing gap length L is considerably higher than the sealing gap width W such that a narrow sealing gap 12 is formed. The sealing gap length L is in the order of a few millimeters while the sealing gap width W is in the order of up to a few dozens of micrometers. Preferably, the sealing gap length L ranges from 3 mm to 6 mm, while the sealing gap width ranges from 5 µm to 20 µm. With such dimensions the sealing gap 12 provides sufficient clearance between the last optical element 9 and the housing 3.1 such that relative motions between the last optical element 9 and the housing 3.1 are possible.

The last optical element 9 is formed by a rotationally symmetric lens. It mainly extends in a first plane and has a first axis of symmetry 9.1 perpendicular to said first plane. In the embodiment shown in FIGS. 2 and 3, the first plane is perpendicular to the plane of the drawing; and the first axis of symmetry 9.1 is coinciding with the optical axis 3.5 of the optical element group 7.

The last optical element 9 is held by the housing 3.1 via a first holding unit 14. This first holding unit 14 is formed by a clamping unit having a nose 14.1 engaging a circumferential groove 9.2 in the circumferential surface 9.3 of the last optical element 9. The clamping unit 14 exerts a radial clamping force on the last optical element 9 which is directed parallel to the first direction 13.1, i.e. parallel to said first plane and directed towards the first axis of symmetry 9.1. In other words, the radial clamping force is essentially perpendicular to the first axis of symmetry 9.1. Thus, the clamping unit provides a support mechanism which combines a frictional connection in the circumferential direction, a form fit in said first plane and a combination of form fit and frictional connection in the direction of the first axis of symmetry 9.1.

The clamping unit 14 is arranged to be resilient along the first direction 13.1 such that it forms an uncoupling device. To this end, its nose 14.1 is connected to its base part 14.2 via a leaf spring element 14.3. The base part 14.2 is rigidly connected to the housing 3.1. The leaf spring element 14.3 is flexible along the first direction 13.1 and, thus, forms a flexure. With this configuration a simple thermal expansion compensation mechanism is obtained which compensates for different thermal expansions of the last optical element 9 and the housing 3.1 during operation of the optical exposure apparatus 1. This uncoupling along the first direction 13.1 leads to reduced deformation of the last optical element 9 during operation and, consequently, to improved and stable imaging properties of optical exposure apparatus 1.

On the other hand, the leaf spring element 14.3 shows a high degree of rigidity along the second direction 13.2 which is parallel to the first axis of symmetry 9.1 of the last optical element 9. Thus, the clamping unit 14 also shows a high degree of rigidity along the second direction 13.2 leading to good and reliable dynamic properties of the support mechanism of the last optical element 9.

The thermal expansion compensation mechanism provided by the clamping unit 14 allows for wide freedom of design in terms of the material to be used for the last optical element 9 and the housing 3.1. This support mechanism does essentially not impose any restrictions to the designers choice. Any material suitable according to other design criteria may be chosen for the last optical element 9 as wells as for the housing 3.1. The clamping element 14 may also be made of any suitable material. In particular, it may be made of the same material as the housing 3.1. For both, the housing 3.1 and the clamping element 14, a material having a high modulus of elasticity is preferred.

In the present embodiment $CaF_2$ is chosen for the last optical element 9 while steel is chosen for the housing 3.1 and the clamping element 14. Anyway, it will be appreciated that, with other embodiments of the present invention, other materials may be chosen such as $SiO_2$ for the last optical element and other suitable metals, metal alloys, ceramics etc. for the housing and the clamping element. Since $CaF_2$ usually is sensitive to being degraded by an immersion medium such as water, the parts of the last optical element 9 contacting the immersion medium are provided with a corresponding protective coating or the like.

The clamping elements allow for easy assembly and disassembly of the last optical element. Anyway, it will be appreciated that, with other embodiments of the present invention, the first holding element does not necessarily have to be a clamping element. Any other connection technique, such as form fit, frictional connection, material fit (bonding, adhesives, soldering etc.) and combinations thereof, may be used for connecting the last optical element and the housing. Preferably, such an embodiment also provides for a corresponding thermal expansion compensation mechanism. Anyway, it will be appreciated that, with other embodiments of the present invention where there is no considerable difference between the coefficients of thermal expansion of the last optical element and the housing, the thermal expansion compensating mechanism may also be omitted.

Two further holding elements in the form of clamping elements—not shown—of identical design are provided to cooperate with the last optical element 9 in a similar manner as clamping element 14. The clamping element 14 and the further clamping elements are distributed equiangularly at the circumference of the last optical element 9 to provide a stable and statically defined support to the last optical element 9.

It will be appreciated that, with other embodiments of the present invention, holding elements of different design may be combined. In particular, it may be sufficient that only one of these holding elements is provided with a thermal expansion compensating mechanism providing for thermal expansion compensation in the plane of the last optical element. Furthermore, another number of holding elements may be provided to support the last optical element.

The clamping element 14, i.e. the first holding element, comprises a positioning device for adjusting the position of the last optical element 9 with respect to the housing 3.1. This positioning device is roughly indicated in FIG. 2 by the axes 14.4 and 14.5 along which adjustment is provided. The respective adjustment mechanism may be of any suitable design. It may be a passive mechanism such as simple spacers, a screw mechanism or the like or combinations thereof. It may also be an active mechanism such as a hydraulic actuator, an electric actuator or combinations thereof.

The positioning device 14.4, 14.5 allows for correction of imaging errors by adjusting the decentering, the position along and the tilt with respect to the optical axis 3.5 of the last optical element 9. Furthermore, the positioning device 14.4, 14.5 allows for adjustment of the sealing gap width W of the sealing gap 12.

A purge unit 15 is connected to the optical element unit 3 to supply a purge medium to the inner part 3.4 of the housing. The purge medium provides for a proper atmosphere within the inner part 3.4 of the housing allowing good and reliable imaging properties of the optical system. The use of such purge media for the above purposes is well known in the art and will not be described here in further detail. The purge medium may be any suitable medium. Usually it is an inert gas.

The purge unit 15 comprises a purge medium source 15.1 connected to a purge medium distribution system—not shown—of the optical element unit 3 distributing the purge medium supplied by the purge medium source 15.1 to different locations within the inner part 3.4 of the housing.

As a part of this purge medium distribution system a purge medium channel 15.2, which is provided within the housing 3.1, is connected to the purge medium source 15.1. This purge medium channel 15.2 guides the purge medium towards the sealing gap 12. Further purge medium channels similar to purge medium channel 15.2 are evenly distributed at the circumference of the last optical element 9. The purge medium is supplied by the purge medium source 15.1 at such a quantity and such a pressure that a continuous flow 16 of purge medium is established, over the entire circumference of the last optical element 9, from the inner part 3.4 of the housing 3.1 through the sealing gap 12 towards the environment external to the housing 3.1.

This continuous flow 16 represents a purge medium barrier or sealing fluid barrier, respectively, that prevents intrusion of contaminants into the inner part 3.4 of the housing 3.1 via the sealing gap 12. In particular, the continuous flow 16 prevents intrusion of fractions of the immersion medium 11 into the inner part 3.4 of the housing 3.1 which might otherwise contaminate the optical elements 8 of the optical element group 7.

The continuous flow 16 does not only prevent the intrusion of liquid or massive substances into the inner part 3.4 of the housing 3.1. It also prevents the intrusion of gaseous substances into the inner part 3.4 of the housing 3.1 by dragging these along away from the sealing gap 12.

The continuous flow 16 exiting from the sealing gap 12 pushes back the fluid surface 11.1 of the immersion medium 11 such that the immersion medium does not exit from the immersion zone 10 via the second gap 17 between the housing 3.1 and the immersion frame 10.1. Thus, the continuous flow 16 also represents a sealing barrier preventing exit of the immersion medium 11 from the immersion zone 10. Instead, the continuous flow 16 exits through the second gap 17 and may be collected by suitable collecting means—not shown—to return the purge medium, via a cleaning device of the purge unit 15, back to the purge medium source 15.1.

Due to the comparatively high sealing gap length L and the small sealing gap width W the sealing gap 12 also forms a restrictor element leading to a comparatively low flow rate of the continuous flow 16. In other words, the sealing function is achieved with a comparatively low flow volume of the purge medium exiting from the sealing gap 12. This is advantageous since, thus, the losses of purge medium, which usually is comparatively expensive, may be kept low.

To further inhibit intrusion of the immersion medium 11 into the narrow sealing gap 12, the first wall element 9.3 of the last optical element 9 bordering the sealing gap 12 and the second wall element 3.6 of the housing 3.1 bordering the sealing gap 12 are coated with a repellent coating. This repellent coating is repellent to the immersion medium 11. In the present example, the repellent coating is a hydrophobic coating, such as a Polytetrafluorethylene (PTFE). Of course, any other suitable repellent coatings may be used. In particular, the repellent coating may be selected as a function of the respective immersion medium.

In the first embodiment, the cylindrical first wall element 9.3 extends essentially parallel to the first axis of symmetry 9.1 of the last optical element 9. Anyway, it will be appreciated that, with other embodiments of the present invention, the first wall element of the last optical element bordering the sealing gap may also be inclined with respect to the first axis of symmetry of the last optical element. In particular, the first wall element may be perpendicular to the first axis of symmetry of the last optical element. Furthermore, the sealing gap may also be bordered by a plurality of wall elements having different inclinations with respect to the first axis of symmetry of the last optical element.

The optical projection system 2, in the first embodiment, only comprises one optical element unit 3 having a single optical axis 3.4. Anyway, it will be appreciated that, with other embodiments of the present invention, the optical projection system may comprise one or more further optical element units holding the optical elements of the optical element group in a plurality of separate sub-groups. Furthermore, it will be appreciated that these optical element units do not have to be aligned along a single optical axis.

Second Embodiment

In the following, a second preferred embodiment of an optical exposure apparatus 101 according to the present invention comprising an optical projection system 102 with an optical element unit 103 according to the present invention will be described with reference to FIGS. 4 and 5.

The optical exposure apparatus 101 is adapted to transfer an image of a pattern formed on a mask 104 onto a substrate 105. To this end, the optical exposure apparatus 101 comprises an illumination system 106 illuminating said mask 104 and the optical element unit 103. The optical element unit 103 projects the image of the pattern formed on the mask 104 onto the substrate 105, e.g. a wafer or the like.

To this end, the optical element unit 103 holds an optical element group 107. This optical element group 107 is held within a housing 103.1 of the optical element unit 103. The optical element group 107 comprises a number of optical elements 108, such as lenses, mirrors or the like, and a last optical element 109 located at an exit end 103.2 of the housing 103.1 adjacent to the substrate 105.

The housing 103.1 is composed of a plurality of housing modules 103.3 stacked and tightly connected to form the optical element unit 103. Each housing module 103.3 holds one or more of the optical elements 108 and 109. The mechanical interfaces of the housing modules 103.3 are sealed to prevent intrusion of contaminants into the inner part 103.4 of the housing 103.1 which might otherwise contaminate and affect the optical elements 108, 109 and lead to a degradation of the imaging properties of the optical element group 107.

The optical projection system 102 receives the part of the light path between the mask 104 and the substrate 105. Its optical elements 108 and 109 cooperate to transfer the image of the pattern formed on the mask 104 onto the substrate 105 located at the end of the light path. To increase the numerical aperture NA of the optical projection system 102, the optical projection system 102 again comprises an immersion zone 110 filled with an immersion medium 111 such as highly purified water.

A part of the exit end 103.2 of the housing 103.1 is immersed in the immersion medium 111 such that the immersion zone 110 is mainly defined by the substrate 105, an immersion frame 110.1 located above the substrate 105 and the last optical element 109. The last optical element 109 thus separates the inner part 103.4 of the housing 103.1 from the environment external to said housing 103.1. In particular, the last optical element 109 separates the inner part 103.4 of the housing 103.1 from the immersion medium 111 present within the immersion zone 111.

The last optical element 109 is held by the housing 103.1 such that a narrow circumferential sealing gap 112 is adjustably formed and defined between the last optical element 109 and the housing 103.1. This sealing gap 112 extends in a circumferential direction along the circumference of the last optical element 109.

Figure 4:
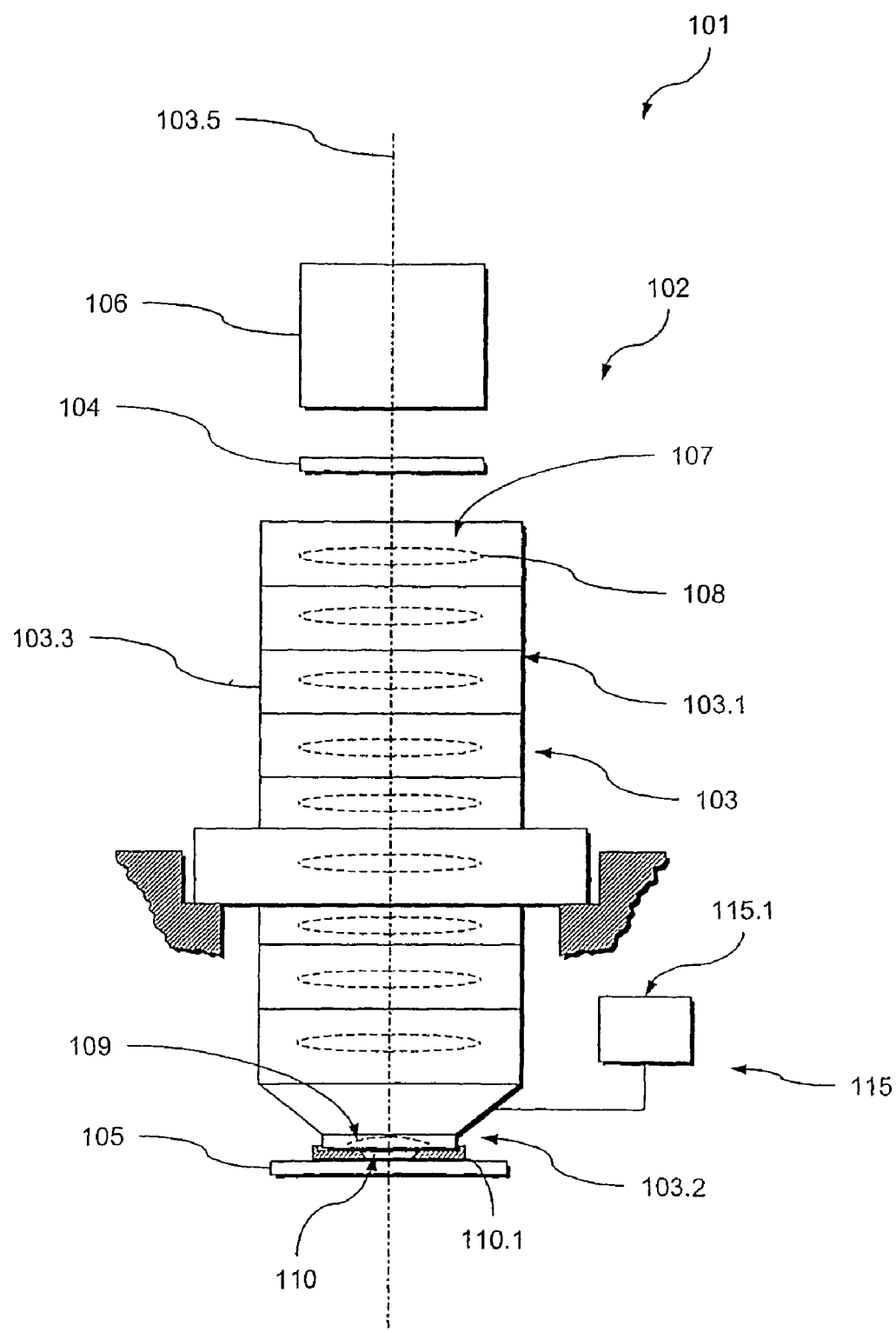
FIG. 4 is a schematic representation of a further preferred embodiment of an optical exposure apparatus according to the present invention comprising a preferred embodiment of an optical element unit according to the present invention.
Figure 5:
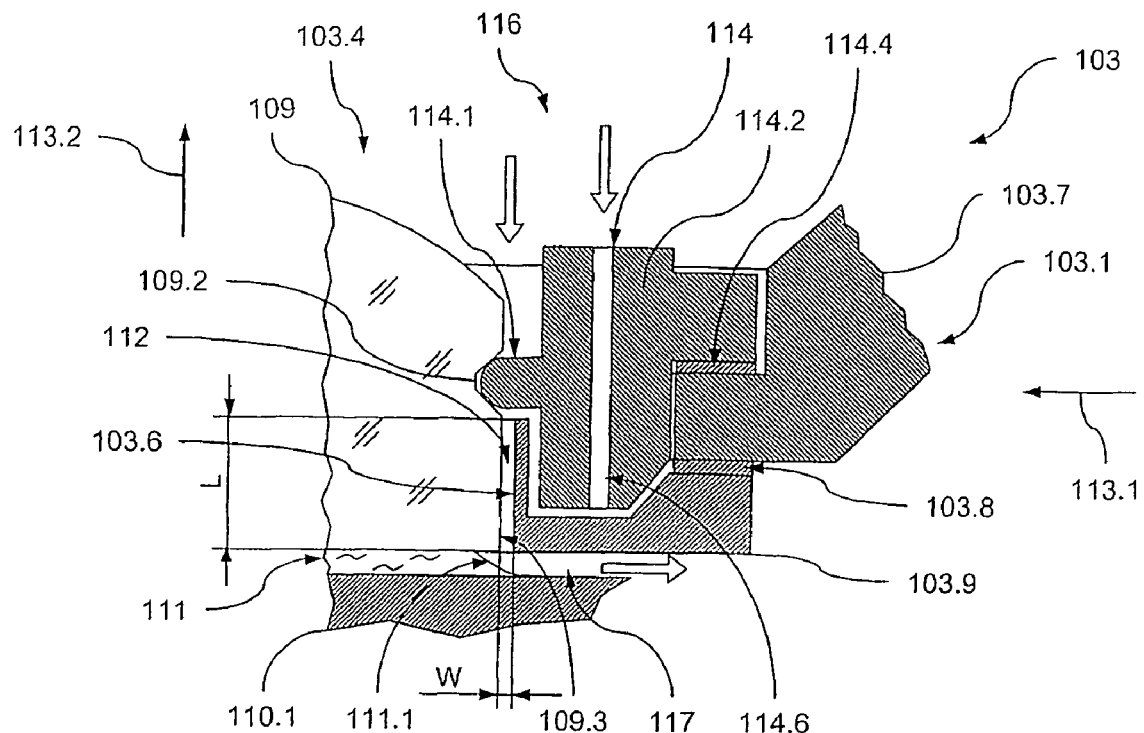
FIG. 5 is a schematic partial representation of the optical element unit of FIG. 4.

In a first sectional plane perpendicular to said circumferential direction, i.e. in a plane coinciding with the plane of FIGS. 4 and 5, the sealing gap 112 forms a passageway between the inner part 103.4 of the housing 103.1 and the environment external to the housing 103.1. The sealing gap 112 has a sealing gap width W transverse to said passageway, i.e. in a first direction 113.1, and a sealing gap length L along said passageway, i.e. in a second direction 113.2. The sealing gap width is defined by the distance between the last optical element 109 and the housing 103.1 in the sealing gap 112.

The sealing gap length L is considerably higher than the sealing gap width W such that a narrow sealing gap 112 is formed. The sealing gap length L is in the order of a few millimeters while the sealing gap width W is in the order of up to a few dozens of micrometers. Preferably, the sealing gap length L ranges from 3 mm to 6 mm, while the sealing gap width ranges from 5 µm to 20 µm. With such dimensions the sealing gap 112 provides sufficient clearance between the last optical element 109 and the housing 103.1 such that relative motions between the last optical element 109 and the housing 103.1 are possible.

The last optical element 109 is formed by a rotationally symmetric lens. It mainly extends in a first plane and has a first axis of symmetry perpendicular to said first plane. In the embodiment shown in FIGS. 4 and 5, the first plane is perpendicular to the plane of the drawing; and the first axis of symmetry is coinciding with the optical axis 103.5 of the optical element group 107.

The last optical element 109 is held by the housing 103.1 via a first holding unit 114. This first holding unit 114 is formed by a clamping unit having a nose 114.1 engaging a circumferential groove 109.2 in the circumferential surface 109.3 of the last optical element 109. The clamping unit 114 exerts a radial clamping force on the last optical element 109 which is directed parallel to the first direction 113.1, i.e. parallel to said first plane and directed towards the first axis of symmetry 109.1. In other words, the radial clamping force is essentially perpendicular to the first axis of symmetry 109.1. Thus, the clamping unit provides a support mechanism which combines a frictional connection in the circumferential direction, a form fit in said first plane and a combination of form fit and frictional connection in the direction of the first axis of symmetry 109.1.

The clamping unit 114 is arranged to be resilient along the first direction 113.1 such that it forms an uncoupling device. To this end, its nose 114.1 is resiliently connected to its base part 114.2 via flexures (not shown). Such flexures are well known in the art such that they will not be described here in further detail. The base part 114.2, in turn, is rigidly connected to a support ring 103.7 of the housing 103.1. The flexures are flexible along the first direction 113.1. Furthermore, the flexures show a high degree of rigidity along the second direction 113.2 which is parallel to the first axis of symmetry of the last optical element 109. With this configuration a simple thermal expansion compensation mechanism is obtained which compensates for different thermal expansions of the last optical element 109 and the housing 103.1 during operation of the optical exposure apparatus 101 while providing good dynamic properties, again leading to the advantages described above in the context of the first embodiment.

Two further holding elements in the form of clamping elements—not shown—of similar design but without the flexures are provided to cooperate with the last optical element 109 in a similar manner as clamping element 114. The clamping element 114 and the further clamping elements are distributed equiangularly at the circumference of the last optical element 109 to provide a stable and statically defined support to the last optical element 109.

The clamping element 114, i.e. the first holding element, comprises a positioning device for adjusting the position of the last optical element 109 with respect to the housing 103.1. This positioning device is provided by a first adjustment unit 114.4 mounted between the clamping element 114 and the support ring 103.7 of the housing 103.1. This first adjustment unit 114.4 provides for positional adjustment in the direction of the optical axis 103.5 and in parallel to the first direction 113.1. Thus, the first adjustment unit 114.4 allows for correction of imaging errors by adjusting the decentering, the position along and the tilt with respect to the optical axis 103.5 of the last optical element 109.

A second adjustment unit 103.8 is mounted between the support ring 103.7 of the housing 103.1 and a sealing ring 103.9 of the housing 103.1. The sealing ring 103.9 forms the second wall element 103.6 defining the sealing gap 112. The second adjustment unit 103.8 provides for positional adjustment of the sealing ring 103.9 in the direction of the optical axis 103.5 and in parallel to the first direction 113.1. Thus, it allows for adjustment of the sealing gap width W and, to some extent, also of the sealing gap length L. This adjustment is independent of the positional adjustment of the last optical element 109 and may be selected exclusively according to the requirements for the sealing gap 112.

The adjustment mechanism of the respective adjustment unit 114.4 and 103.8 may be of any suitable design. It may be a passive mechanism such as simple spacers, a screw mechanism or the like or combinations thereof. It may also be an active mechanism such as a hydraulic actuator, an electric actuator or combinations thereof.

A purge unit 115 is connected to the optical element unit 103 to supply a purge medium to the inner part 103.4 of the housing. The purge medium provides for a proper atmosphere within the inner part 103.4 of the housing as it has been described above in the context of the first embodiment. The purge medium may be any suitable fluid, such as a liquid or a gas. Usually it is an inert gas.

The purge unit 115 comprises a purge medium source 115.1 connected to a purge medium distribution system—not shown—of the optical element unit 103 distributing the purge medium supplied by the purge medium source 115.1 to different locations within the inner part 103.4 of the housing.

This purge medium distribution system also guides the purge medium, in a manner evenly distributed around the circumference of the last optical element 109 towards the exit end 103.2 of the housing and, thus, towards the sealing gap 112. The purge medium is supplied by the purge medium source 115.1 at such a quantity and such a pressure that a continuous flow 116 of purge medium is established, over the entire circumference of the last optical element 109, from the inner part 103.4 of the housing 103.1 through the sealing gap 112 towards the environment external to the housing 103.1.

In this context, the gap 114.6 between the nose part 114.1 and the base part 114.2 of the clamping unit 114 forms a purge medium channel providing improved supply of the purge medium towards the section of the sealing gap 112 located below the nose part 114.1 of the clamping unit 114.

The continuous flow 116 of purge medium represents a purge medium barrier or sealing fluid barrier, respectively, that prevents intrusion of contaminants into the inner part 103.4 of the housing 103.1 via the sealing gap 112, leading to the advantages described above in the context of the first embodiment. In particular, the continuous flow 116 prevents intrusion of fractions of the immersion medium 111 into the inner part 103.4 of the housing 103.1 which might otherwise contaminate the optical elements 108 of the optical element group 107.

The continuous flow 116 exiting from the sealing gap 112 pushes back the fluid surface 111.1 of the immersion medium 111 such that the immersion medium does not exit from the immersion zone 110 via the second gap 117 between the sealing ring 103.9 of the housing 103.1 and the immersion frame 110.1. Thus, the continuous flow 116 also represents a sealing barrier preventing exit of the immersion medium 111 from the immersion zone 110. Instead, the continuous flow 116 exits through the second gap 117 and may be collected by suitable collecting means—not shown—to return the purge medium, via a cleaning device of the purge unit 115, back to the purge medium source 115.1.

Again, due to the comparatively high sealing gap length L and the small sealing gap width W the sealing gap 12 also forms a restrictor element leading to a comparatively low flow rate of the continuous flow 16 leading to the advantages already described above in the context of the first embodiment.

To further inhibit intrusion of the immersion medium 111 into the narrow sealing gap 112, the first wall element 109.3 of the last optical element 109 bordering the sealing gap 112 and the second wall element 103.6 of the housing 103.1 bordering the sealing gap 112 are coated with a repellent coating. This repellent coating is repellent to the immersion medium 111. In the present example, the repellent coating is a hydrophobic coating, such as a Polytetrafluorethylene (PTFE). Of course, any other suitable repellent coatings may be used. In particular, the repellent coating may be selected as a function of the respective immersion medium.

Third Embodiment

In the following, a third preferred embodiment of an optical exposure apparatus 201 according to the present invention comprising an optical projection system 202 with an optical element unit 203 according to the present invention will be described with reference to FIGS. 6 and 7.

The optical exposure apparatus 201 is adapted to transfer an image of a pattern formed on a mask 204 onto a substrate 205. To this end, the optical exposure apparatus 201 comprises an illumination system 206 illuminating said mask 204 and the optical element unit 203. The optical element unit 203 projects the image of the pattern formed on the mask 204 onto the substrate 205, e.g. a wafer or the like.

To this end, the optical element unit 203 holds an optical element group 207. This optical element group 207 is held within a housing 203.1 of the optical element unit 203. The optical element group 207 comprises a number of optical elements 208, such as lenses, mirrors or the like, and a last optical element 209 located at an exit end 203.2 of the housing 203.1 adjacent to the substrate 205.

The housing 203.1 is composed of a plurality of housing modules 203.3 stacked and tightly connected to form the optical element unit 203. Each housing module 203.3 holds one or more of the optical elements 208 and 209. The mechanical interfaces of the housing modules 203.3 are sealed to prevent intrusion of contaminants into the inner part 203.4 of the housing 203.1 which might otherwise contaminate and affect the optical elements 208, 209 and lead to a degradation of the imaging properties of the optical element group 207.

The optical projection system 202 receives the part of the light path between the mask 204 and the substrate 205. Its optical elements 208 and 209 cooperate to transfer the image of the pattern formed on the mask 204 onto the substrate 205 located at the end of the light path. To increase the numerical aperture NA of the optical projection system 202, the optical projection system 202 again comprises an immersion zone 210 filled with an immersion medium 211 such as highly purified water.

A part of the exit end 203.2 of the housing 203.1 is immersed in the immersion medium 211 such that the immersion zone 210 is mainly defined by the substrate 205, an immersion frame 210.1 located above the substrate 205 and the last optical element 209. The last optical element 209 thus separates the inner part 203.4 of the housing 203.1 from the environment external to said housing 203.1. In particular, the last optical element 209 separates the inner part 203.4 of the housing 203.1 from the immersion medium 211 present within the immersion zone 211.

The last optical element 209 is held by the housing 203.1 such that a narrow circumferential sealing gap 212 is formed and defined between the last optical element 209 and the housing 203.1. This sealing gap 212 extends in a circumferential direction along the circumference of the last optical element 209.

In a first sectional plane perpendicular to said circumferential direction, i.e. in a plane coinciding with the plane of FIGS. 4 and 5, the sealing gap 212 forms a passageway between the inner part 203.4 of the housing 203.1 and the environment external to the housing 203.1. The sealing gap 212 has a sealing gap width W transverse to said passageway, i.e. in a second direction 213.2, and a sealing gap length L along said passageway, i.e. in a first direction 213.1. The sealing gap width W is defined by the distance between the last optical element 209 and the housing 203.1 in the sealing gap 212.

The sealing gap length L is considerably higher than the sealing gap width W such that a narrow sealing gap 212 is formed. The sealing gap length L is in the order of a few millimeters while the sealing gap width W is in the order of up to a few dozens of micrometers. Preferably, the sealing gap length L ranges from 3 mm to 6 mm, while the sealing gap width ranges from 5 µm to 20 µm. With such dimensions the sealing gap 212 provides sufficient clearance between the last optical element 209 and the housing 203.1 such that relative motions between the last optical element 209 and the housing 203.1 are possible.

The last optical element 209 is formed by a rotationally symmetric plane parallel plate. It mainly extends in a first plane and has a first axis of symmetry perpendicular to said first plane. In the third embodiment shown in FIGS. 6 and 7, the first plane is perpendicular to the plane of the drawing; and the first axis of symmetry is coinciding with the optical axis 203.5 of the optical element group 207.

Other than in the first and second embodiment, the sealing gap 212 is bordered by a first wall element 209.4 of the last optical element 209 that is parallel to the first plane, i.e. perpendicular to the first axis of symmetry of the last optical element 209 and, thus, perpendicular to the optical axis 203.5 of the optical element group 207.

The last optical element 209 is held by the housing 203.1 via a first holding unit 214. This first holding unit 214 is formed by a clamping unit having a nose 214.1 engaging a circumferential groove 209.2 in the circumferential surface 209.3 of the last optical element 209. The clamping unit 214 exerts a radial clamping force on the last optical element 209 which is directed parallel to the first direction 213.1, i.e. parallel to said first plane and directed towards the first axis of symmetry 209.1. In other words, the radial clamping force is essentially perpendicular to the first axis of symmetry 209.1. Thus, the clamping unit provides a support mechanism which combines a frictional connection in the circumferential direction, a form fit in said first plane and a combination of form fit and frictional connection in the direction of the first axis of symmetry 209.1.

The clamping unit 214 is arranged to be resilient along the first direction 213.1 such that it forms an uncoupling device. To this end, its nose 214.1 is resiliently connected to its base part 214.2 via flexures (not shown). Such flexures are well known in the art such that they will not be described here in further detail. The base part 214.2, in turn, is rigidly connected to a support ring 203.7 of the housing 203.1. The flexures are flexible along the first direction 213.1. Furthermore, the flexures show a high degree of rigidity along the second direction 213.2 which is parallel to the first axis of symmetry of the last optical element 209. With this configuration a simple thermal expansion compensation mechanism is obtained which compensates for different thermal expansions of the last optical element 209 and the housing 203.1 during operation of the optical exposure apparatus 201 while providing good dynamic properties, again leading to the advantages described above in the context of the first embodiment.

Two further holding elements in the form of clamping elements—not shown—of similar design but without the flexures are provided to cooperate with the last optical element 209 in a similar manner as clamping element 214. The clamping element 214 and the further clamping elements are distributed equiangularly at the circumference of the last optical element 209 to provide a stable and statically defined support to the last optical element 209.

The clamping element 214, i.e. the first holding element, comprises a positioning device for adjusting the position of the last optical element 209 with respect to the housing 203.1. This positioning device is provided by a first adjustment unit 214.4 mounted between the clamping element 214 and the support ring 203.7 of the housing 203.1. This first adjustment unit 214.4 provides for positional adjustment in the direction of the optical axis 203.5. Thus, the first adjustment unit 214.4 allows for correction of imaging errors by adjusting the position of the last optical element 209 along the optical axis 203.5 and the tilt of the last optical element 209 with respect to the optical axis 203.5.

A second adjustment unit 203.8 is mounted between the support ring 203.7 of the housing 203.1 and a sealing ring 203.9 of the housing 203.1. The sealing ring 203.9 forms the second wall element 203.6 defining the sealing gap 212. The second adjustment unit 203.8 provides for positional adjustment of the sealing ring 203.9 in the direction of the optical axis 203.5 and in parallel to the first direction 213.1. Thus, it allows for adjustment of the sealing gap width W. This adjustment is independent of the positional adjustment of the last optical element 209 and may be selected exclusively according to the requirements for the sealing gap 212.

The adjustment mechanism of the respective adjustment unit 214.4 and 203.8 may be of any suitable design. It may be a passive mechanism such as simple spacers, a screw mechanism or the like or combinations thereof. It may also be an active mechanism such as a hydraulic actuator, an electric actuator or combinations thereof.

A sealing unit 215 is connected to the optical element unit 203 to supply a sealing fluid to the inner part 203.4 of the housing. The sealing fluid may be a purge medium a as it has been described above in the context of the first and second embodiment. The sealing fluid may be any suitable fluid, such as a liquid or a gas, preferably an inert gas.

The sealing unit 215 comprises a sealing fluid source 215.1 connected to a sealing fluid distribution system—not shown—of the optical element unit 203 distributing the sealing fluid supplied by the sealing fluid source 215.1 to different locations at the circumference of the last optical element 209 within the inner part 203.4 of the housing 203.1.

As a part of this sealing fluid distribution system a sealing fluid channel 15.2, which is provided within the sealing ring 203.9 of the housing 203.1, is connected to the sealing fluid source 215.1. This sealing fluid channel 215.2 guides the sealing fluid towards the sealing gap 12. Further sealing fluid channels similar to sealing fluid channel 215.2 are evenly distributed at the circumference of the last optical element 209. The sealing fluid is supplied by the sealing fluid source 215.1 at such a quantity and such a pressure that it builds up a stable sealing fluid barrier within the sealing gap 212.

This sealing fluid barrier prevents intrusion of liquid and massive contaminants into the inner part 203.4 of the housing 203.1 via the sealing gap 212, leading to the advantages described above in the context of the first embodiment.

The sealing fluid barrier within the sealing gap 212 pushes back the fluid surface 211.1 of the immersion medium 211 such that the immersion medium does not intrude into the inner part 203.4 of the housing 203.1 via the sealing gap 212.

To further inhibit intrusion of the immersion medium 211 into the narrow sealing gap 212, the first wall element 209.4 of the last optical element 209 bordering the sealing gap 212 and the second wall element 203.6 of the housing 203.1 bordering the sealing gap 212 are coated with a repellent coating. This repellent coating is repellent to the immersion medium 211. In the present example, the repellent coating is a hydrophobic coating, such as a Polytetrafluorethylene (PTFE). Of course, any other suitable repellent coatings may be used. In particular, the repellent coating may be selected as a function of the respective immersion medium.

To prevent the intrusion of gaseous substances into the inner part 3.4 of the housing 3.1 the sealing unit 215 comprises an exhaust unit 215.3 connected to an exhaust channel 215.4 provided within the sealing ring 203.9 of the housing 203.1. The exhaust channel 215.4 has an inlet 215.5 that is associated to the sealing gap 212. Further exhaust channels similar to exhaust channel 215.4 are evenly distributed at the circumference of the last optical element 209. Via these exhaust channels 215.4, the exhaust unit 215.3 draws off gaseous substances from the inner part 203.4 of the housing 203.1.

To reduce the amount of sealing fluid to be provided by the sealing fluid source 215.1 and the flow rate to be provided by the exhaust unit 215.3, there is provided a narrow third gap 203.10 between the sealing ring 203.9 and the last optical element 209. This third gap 203.10 is located between the sealing fluid channel 215.2 and the exhaust channel 215.4. The third gap 203.10 forms a restrictor element reducing the flow rate of substances entering into the inner part 203.4 of the housing 203.1 via the third gap 203.10.

The exhaust unit 215.3 may be dimensioned such that, in case the sealing fluid source 215.1 is not working, the exhaust unit 215.3 is able to draw off any immersion medium or other substances entering via the sealing gap 212 and the third gap 203.10 into the inner part 203.4 of the housing 203.1.

Anyway, it will be appreciated that, with other embodiments of the present invention, a separate exhaust unit may be provided for such purposes. Furthermore, it will be appreciated that, with other embodiments of the present invention, the exhaust unit described in the context of the third embodiment may also be implemented together with the first and second embodiment described above.

Fourth Embodiment

In the following, a fourth preferred embodiment of an optical element unit 303 according to the present invention will be described with reference to FIG. 8. The optical element unit 303 may replace the optical element unit 203 within the optical exposure apparatus 201 of FIG. 6.

Similar to the third embodiment, a last optical element 309 is held by a housing 303.1. The last optical element 309 is held by the housing 303.1 via first holding units in the form of clamping units similar to the ones described above in the context of the third embodiment. Thus, in this context, it is here only referred to the above explanations.

Figure 7:
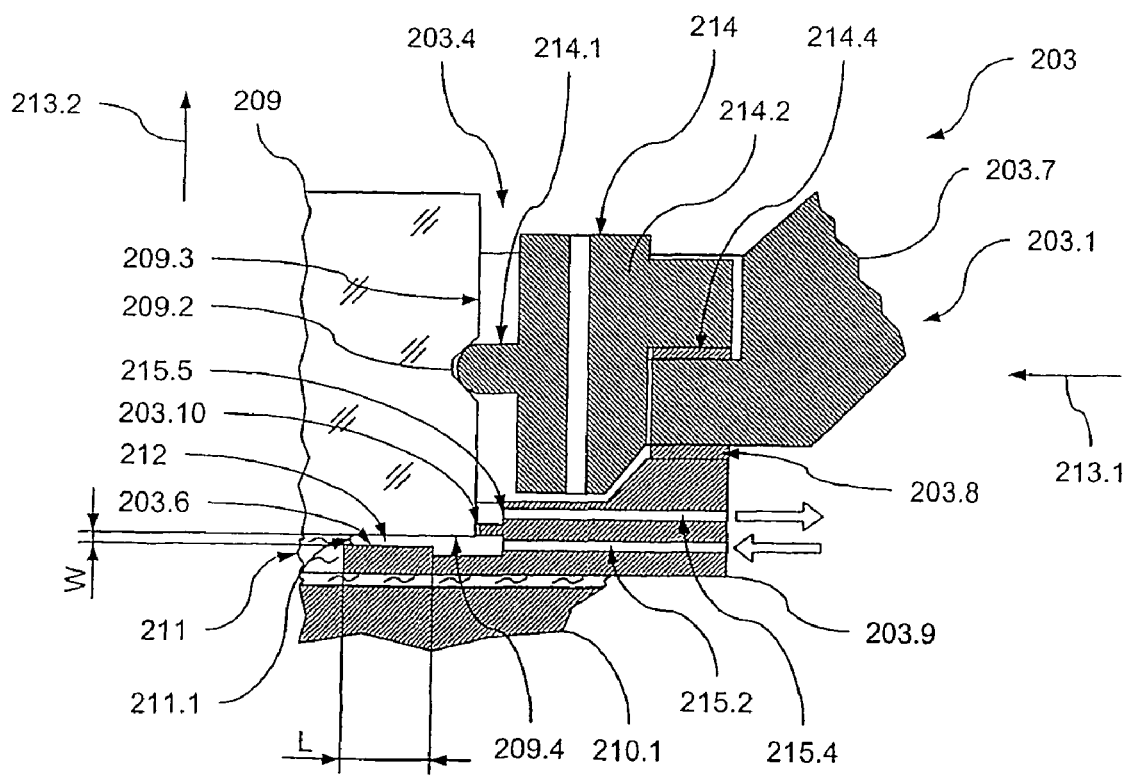
FIG. 7 is a schematic partial representation of the optical element unit of FIG. 6.

The last optical element 309 is held by the housing 303.1 such that a narrow circumferential first sealing gap 312.1 and a narrow circumferential second sealing gap 312.2 is formed and defined between the last optical element 309 and a sealing ring 303.9 of the housing 303.1 in a configuration similar to the one of FIG. 7. The sealing gaps 312.1 and 312.2 communicate via a sealing fluid chamber 312.3 located between them. The sealing gaps 312.1 and 312.2 and the sealing fluid chamber 312.3 each extend in a circumferential direction along the circumference of the last optical element 309.

Figure 8:
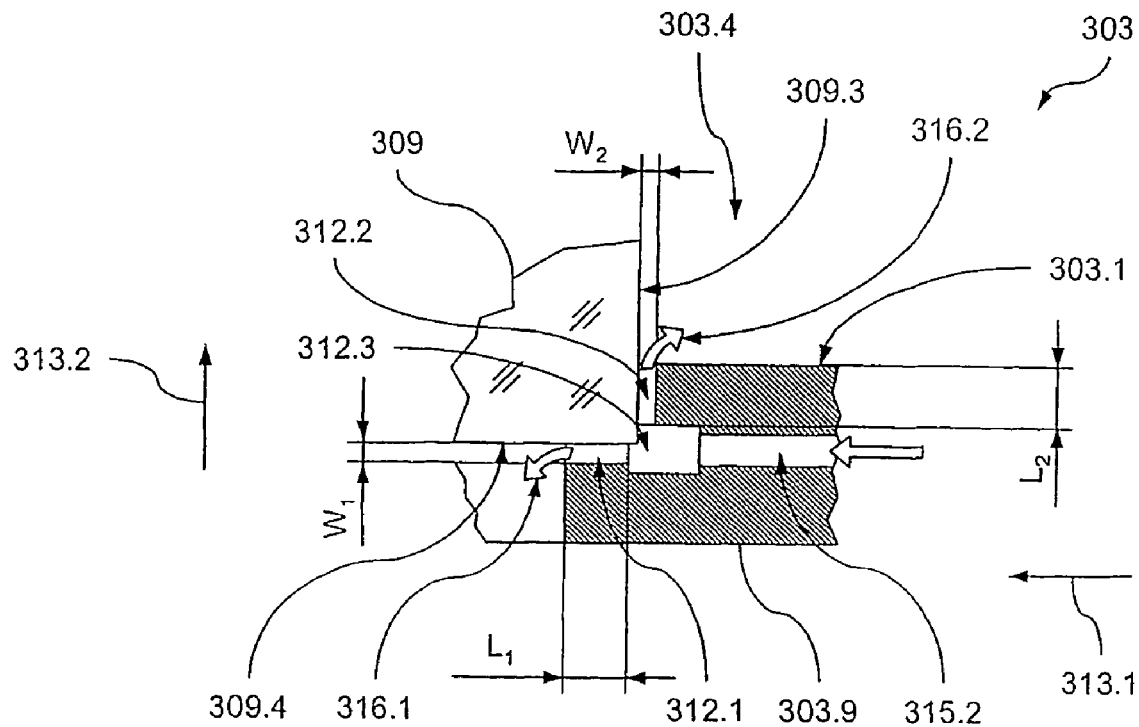
FIG. 8 is a schematic partial representation of a further preferred embodiment of an optical element unit according to the present invention.

In a first sectional plane perpendicular to said circumferential direction, i.e. in a plane coinciding with the plane of FIG. 8, the first sealing gap 312.1, the sealing fluid chamber 312.3 and the second sealing gap 312.2 form a passageway between the inner part 303.4 of the housing 303.1 and the environment external to the housing 303.1.

The first sealing gap 312.1 has a first sealing gap width $W_1$ transverse to said passageway, i.e. in a second direction 313.2, and a first sealing gap length $L_1$ along said passageway, i.e. in a first direction 313.1. The first sealing gap width W is defined by the distance between the last optical element 309 and the housing 303.1 in the region of the first sealing gap 312.1.

The second sealing gap 312.2 has a second sealing gap width $W_2$ transverse to said passageway, i.e. in the first direction 313.1, and a second sealing gap length $L_2$ along said passageway, i.e. in the second direction 313.2. The second sealing gap width $W_2$ is defined by the distance between the last optical element 309 and the housing 303.1 in the region of the second sealing gap 312.2.

The respective sealing gap length $L_1$ and $L_2$ is considerably higher than the respective sealing gap width $W_1$ and $W_2$ such that a narrow sealing gap 312.1 and 312.2, respectively, is formed. The respective sealing gap length $L_1$ and $L_2$ is in the order of a few millimeters while the respective sealing gap width $W_1$ and $W_2$ is in the order of up to a few dozens of micrometers. Preferably, the respective sealing gap length $L_1$ and $L_2$ ranges from 3 mm to 6 mm, while the respective sealing gap width $W_1$ and $W_2$ ranges from 5 µm to 30 µm. With such dimensions the respective sealing gap 312.1 and 312.2 provides sufficient clearance between the last optical element 309 and the housing 303.1 such that relative motions between the last optical element 309 and the housing 303.1 are possible.

The last optical element 309 is again formed by a rotationally symmetric plane parallel plate. It mainly extends in a first plane and has a first axis of symmetry perpendicular to said first plane. In the fourth embodiment shown in FIG. 8, the first plane is perpendicular to the plane of the drawing; and the first axis of symmetry is coinciding with the optical axis 203.5 of the optical element group 207 when used in the optical exposure apparatus 201 of FIG. 6.

Adjustment units—not shown—similar to the ones described above in the context of the third embodiment, in particular in the context of FIG. 7, provide for adjustment of the first sealing gap width $W_1$ and the second sealing gap width $W_2$, respectively. This adjustment is independent of the positional adjustment of the last optical element 309 and may be selected exclusively according to the requirements for the respective sealing gap 312.1 and 312.2. The adjustment mechanism of the respective adjustment unit may be of any suitable design. It may be a passive mechanism such as simple spacers, a screw mechanism or the like or combinations thereof. It may also be an active mechanism such as a hydraulic actuator, an electric actuator or combinations thereof.

Figure 6:
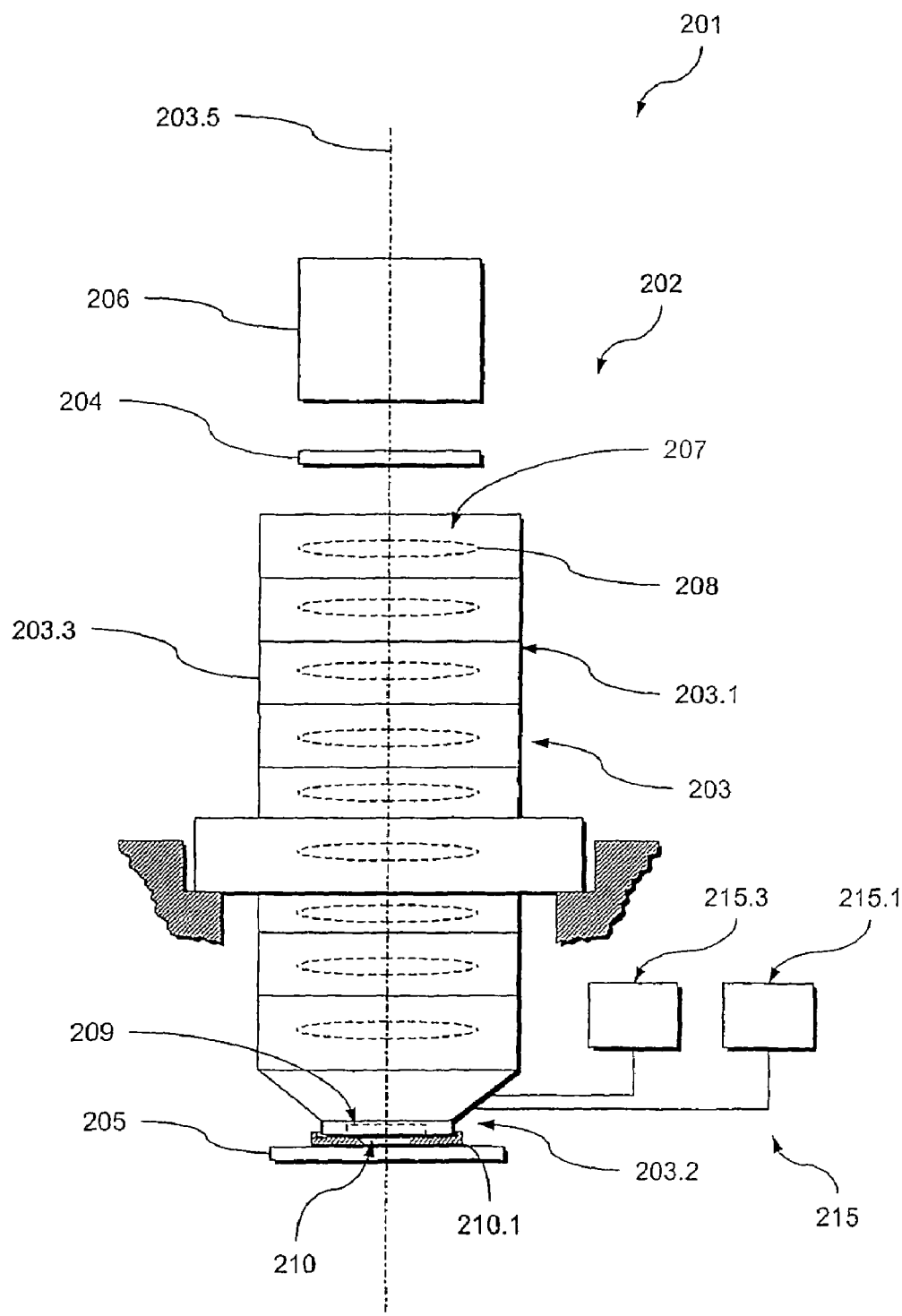
FIG. 6 is a schematic representation of a further preferred embodiment of an optical exposure apparatus according to the present invention comprising a preferred embodiment of an optical element unit according to the present invention.

A sealing unit such as the sealing unit 215 of FIG. 6 is connected to the optical element unit 303 to supply a sealing fluid to the inner part 303.4 of the housing. The sealing fluid may be a purge medium a as it has been described above in the context of the first, second and third embodiment. The sealing fluid may be any suitable fluid, such as a liquid or a gas, preferably an inert gas.

The sealing unit comprises a sealing fluid source such as the sealing fluid source 215 of FIG. 6 connected to a sealing fluid distribution system—not shown—of the optical element unit 303 distributing the sealing fluid supplied by the sealing fluid source to different locations at the circumference of the last optical element 309 within the inner part 303.4 of the housing 303.1.

As a part of this sealing fluid distribution system a sealing fluid channel 315.2, which is provided within the sealing ring 303.9 of the housing 303.1, is connected to the sealing fluid source. This sealing fluid channel 315.2 guides the sealing fluid or purge medium towards the sealing fluid chamber 312.3 and, thus, to the first sealing gap 312.1 and the second sealing gap 312.2. Further sealing fluid channels similar to sealing fluid channel 315.2 are evenly distributed at the circumference of the last optical element 309. The purge medium is supplied by the purge medium source at such a quantity and such a pressure that a continuous first flow 316.1 of purge medium is established, over the entire circumference of the last optical element 309, from the inner part 303.4 of the housing 303.1 through the first sealing gap 312.1 towards the environment external to the housing 303.1.

This continuous first flow 316.1 represents a purge medium barrier or sealing fluid barrier, respectively, that prevents intrusion of contaminants into the inner part 303.4 of the housing 303.1 via the first sealing gap 312.1. In particular, the continuous first flow 316.1 prevents intrusion of fractions of an immersion medium into the inner part 303.4 of the housing 303.1 which might otherwise contaminate the optical elements of the optical element group.

The continuous first flow 316.1 does not only prevent the intrusion of liquid or massive sub-stances into the inner part 303.4 of the housing 303.1. It also prevents the intrusion of gaseous substances into the inner part 303.4 of the housing 303.1 by dragging these along away from the first sealing gap 312.1.

Due to the comparatively high first sealing gap length $L_1$ and the small first sealing gap width $W_1$ the first sealing gap 312.1 also forms a restrictor element leading to a comparatively low flow rate of the first continuous flow 316.1. In other words, the sealing function is achieved with a comparatively low flow volume of the purge medium exiting from the first sealing gap 312. This is advantageous since, thus, the losses of purge medium, which usually is comparatively expensive, may be kept low.

Furthermore, a continuous second flow 316.2 of purge medium is established, over the entire circumference of the last optical element 309, through the second sealing gap 312.2 towards the inner part 303.4 of the housing 303.1. The second sealing gap length $L_2$ and the second sealing gap width $W_2$ are selected such that the second sealing gap 312.2 forms a restrictor element leading to a flow rate of the second continuous flow 316.2 which is smaller than the flow rate of the first continuous flow 316.1. To this end, in particular, the second sealing gap width $W_2$ may be smaller than the first sealing gap width $W_1$. By suitably selecting the respective first and second sealing gap dimensions, the ratio between the flow rate of the first continuous flow 316.1 and the flow rate of the second continuous flow 316.2 may be adapted to any desired value.

An advantage of the more restrictive second sealing gap 312.2 lies within the fact that it forms a high resistance to the intrusion gas etc. Thus, it largely prevents a rise in the pressure within the inner part 303.4 of the housing 303.1 due to providing of sealing fluid to the sealing fluid chamber 312.3 which might otherwise cause unwanted deformation of the last optical element 309.

It will be appreciated that, to prevent such adverse pressure alteration effects on the ultimate optical elements, as a general rule, it may be advisable to effect the continuous flow through the respective sealing gap only via a pressure gradient generated and largely limited to the region of the respective sealing gap by suitable means.

A further advantage of the more restrictive second sealing gap 312.2 lies within the fact that it forms a further resistance to the intrusion of contaminants in case of a failure of the purge medium supply via the sealing fluid channel 315.2. In this case the sealing fluid channel 315.2 may be used to withdraw substances that have intruded via the first sealing gap 312.1 into the sealing fluid chamber 312.3 but are still prevented from further intruding into the inner part 303.4 of the housing 303.1 by the second sealing gap 312.2.

To further inhibit intrusion of an immersion medium into the narrow sealing gaps 312.1 and 312.2, the wall elements bordering the respective sealing gap 312.1 and 312.2 are coated with a repellent coating. This repellent coating is repellent to the immersion medium. In the present example, the repellent coating is a hydrophobic coating, such as a Polytetrafluorethylene (PTFE). Of course, any other suitable repellent coatings may be used. In particular, the repellent coating may be selected as a function of the respective immersion medium.

As can be seen from FIG. 8, the first sealing gap 312.1 is bordered by a first wall element 309.4 of the last optical element 309 that is parallel to the first plane, i.e. perpendicular to the first axis of symmetry of the last optical element 309. The second sealing gap 312.2 is bordered by a second wall element 309.3 of the last optical element 309 that is parallel to the first axis of symmetry of the last optical element 309, i.e. perpendicular to the first plane. As a result, the first wall element 309.4 is perpendicular to the second wall element 309.3.

Anyway, it will be appreciated that, with other embodiments of the invention, any other suitable orientation of the first and second wall element of the last optical element bordering the respective first and second sealing gap may be chosen with respect to the first axis of symmetry of the last optical element as well as with respect to each other. In particular, the first and second wall element may have any other inclination with respect to each other as well as with respect to the first axis of symmetry of the last optical element. Furthermore, again, the respective sealing gap may also be bordered by a plurality of wall elements having different inclinations with respect to the first axis of symmetry of the last optical element.

Fifth Embodiment

Figure 9:
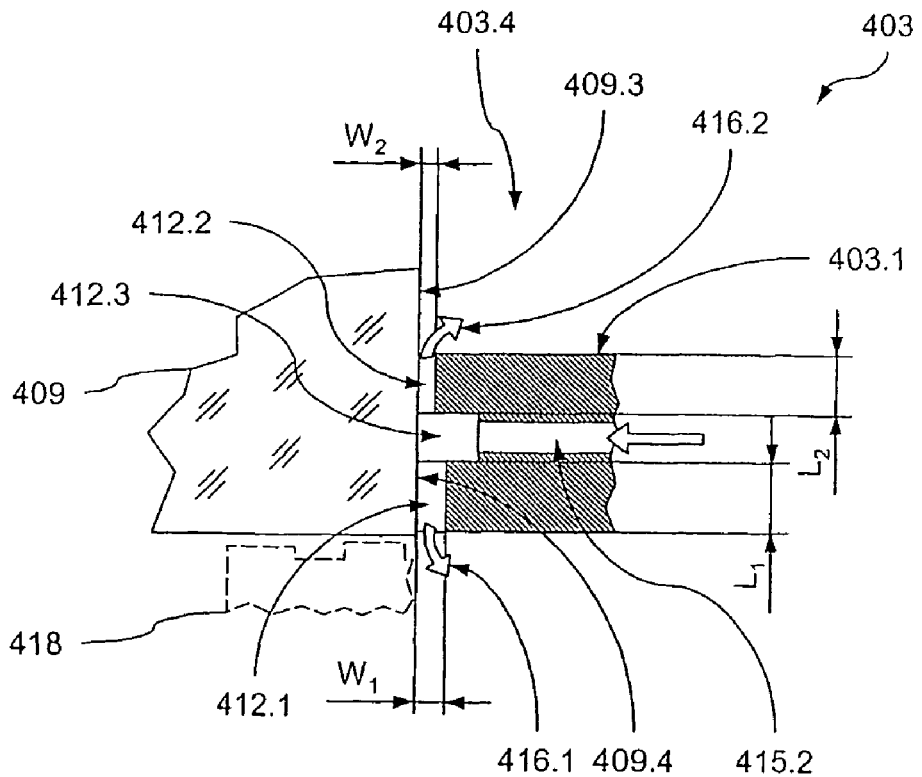
FIG. 9 is a schematic partial representation of a further preferred embodiment of an optical element unit according to the present invention.

In the following, a fifth preferred embodiment of an optical element unit 403 according to the present invention will be described with reference to FIG. 9. The optical element unit 403 in its functionality and design largely corresponds to the optical element unit 303 of FIG. 8. In particular, the last optical element 409 is of a design that is identical with the one of last optical element 309 of FIG. 8. Thus, it will here be mainly referred to the differences.

The main difference lies within the fact that the first sealing gap 412.1 is bordered by a first wall element 409.4 of the last optical element 409 that is parallel to the first axis of symmetry of the last optical element 409, i.e. perpendicular to the first plane in which the last optical element 409 mainly extends. The second sealing gap 412.2 is bordered by a second wall element 409.3 of the last optical element 409 that is as well parallel to the first axis of symmetry of the last optical element 409, i.e. perpendicular to the first plane. Furthermore, the first wall element 409.4 and the second wall element 409.3 coincide, i.e. they are both formed by a cylindrical outer wall of the last optical element 409.

Here again, the sealing gaps 412.1 and 412.2 communicate via a sealing fluid chamber 412.3 located between them. The first sealing gap 412.1, the sealing fluid chamber 412.3 and the second sealing gap 412.2 form a passageway between the inner part 403.4 of the housing 403.1 and the environment external to the housing 403.1.

The first sealing gap 412.1 has a first sealing gap width $W_1$ and a first sealing gap length $L_1$. The second sealing gap 412.2 has a second sealing gap width $W_2$ and a second sealing gap length $L_2$. The respective sealing gap length $L_1$ and $L_2$ is considerably higher than the respective sealing gap width $W_1$ and $W_2$ such that a narrow sealing gap 412.1 and 412.2, respectively, is formed.

Again, the respective sealing gap length $L_1$ and $L_2$ is in the order of a few millimeters while the respective sealing gap width $W_1$ and $W_2$ is in the order of up to a few dozens of micrometers. Preferably, the respective sealing gap length $L_1$ and $L_2$ ranges from 3 mm to 6 mm, while the respective sealing gap width $W_1$ and $W_2$ ranges from 5 μm to 40 μm. With such dimensions the respective sealing gap 412.1 and 412.2 provides sufficient clearance between the last optical element 409 and the housing 403.1 such that relative motions between the last optical element 409 and the housing 403.1 are possible.

As in the fourth embodiment, a sealing unit supplies a sealing fluid or purge medium to a sealing fluid channel 415.2, which is provided within the sealing ring 403.9 of the housing 403.1. This sealing fluid channel 415.2 guides the sealing fluid towards the sealing fluid chamber 412.3 and, thus, to the first sealing gap 412.1 and the second sealing gap 412.2. Further sealing fluid channels similar to the sealing fluid channel 415.2 are evenly distributed at the circumference of the last optical element 409. The sealing fluid is supplied at such a quantity and such a pressure that a continuous first flow 416.1 of sealing fluid forming a sealing fluid barrier is established, over the entire circumference of the last optical element 409, from the sealing fluid chamber 412.3 through the first sealing gap 412.1 towards the environment external to the housing 403.1.

Furthermore, as in the fourth embodiment, a continuous second flow 416.2 of purge medium is established, over the entire circumference of the last optical element 409, through the second sealing gap 412.2 towards the inner part 403.4 of the housing 403.1. The second sealing gap length $L_2$ and the second sealing gap width $W_2$ are again selected such that the second sealing gap 412.2 forms a restrictor element leading to a flow rate of the second continuous flow 416.2 which is smaller than the flow rate of the first continuous flow 416.1.

To further inhibit intrusion of an immersion medium into the narrow sealing gaps 412.1 and 412.2, the wall elements bordering the respective sealing gap 412.1 and 412.2 are coated with a repellent coating.

It will be appreciated that, with other embodiments of the invention, any other suitable orientation of the first and second wall element of the last optical element bordering the respective first and second sealing gap may be chosen. In particular, the first and second wall element may be formed by the lower surface of the last optical element providing a configuration as it is indicated by the dashed contour 418 in FIG. 9.

Sixth Embodiment

Figure 10:
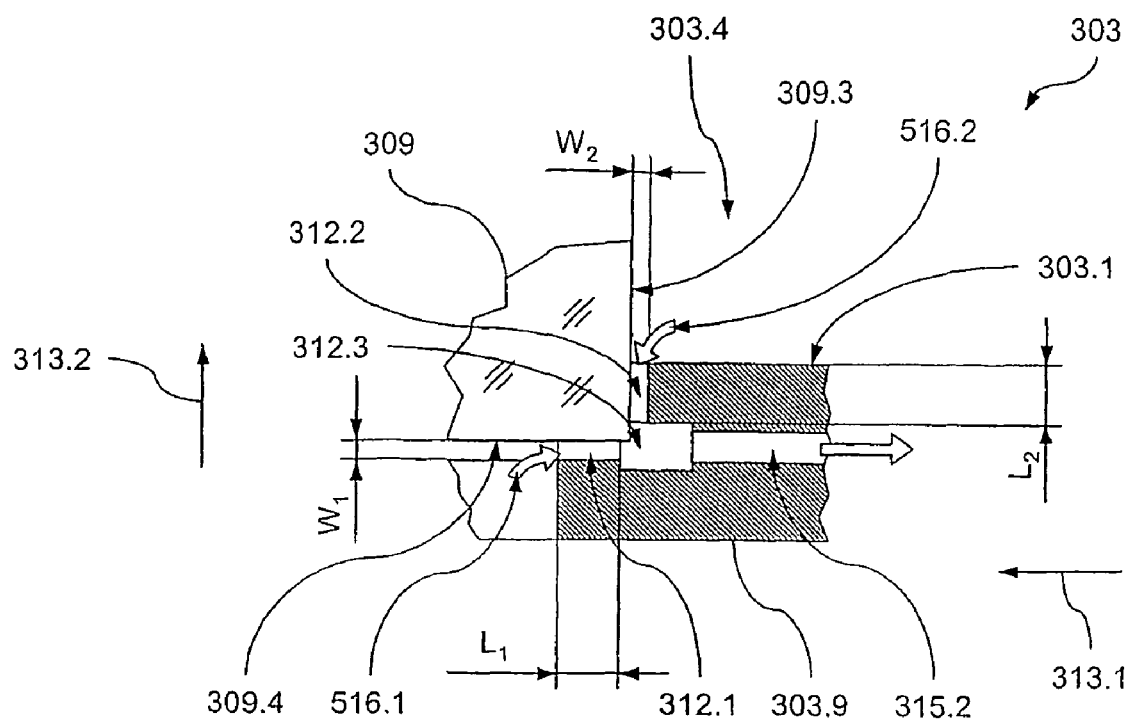
FIG. 10 is a schematic partial representation of a further preferred embodiment of an optical element unit according to the present invention.

In the following, a sixth preferred embodiment of an optical element unit according to the present invention will be described with reference to FIG. 10. The optical element unit is identical to the optical element unit 303 of FIG. 8 such that identical reference numerals are used and reference is made to the above explanations in their context.

The only difference with respect to the fourth embodiment lies within the fact that, instead of supplying a sealing fluid to the sealing fluid chamber 312.3 and, thus, to the first sealing gap 312.1 and the second sealing gap 312.2, a negative pressure is provided to the fluid channels 315.2 via a suitable exhaust unit. This is done to such an extent that any medium or substance entering the sealing fluid chamber 312.3 is drawn off via the fluid channels 315.2. In other words, the fluid channels 315.2 then act as exhaust channels.

As a consequence, on the on hand, a continuous first flow 516.1 of a fraction of the atmosphere external to the housing 303.1 is established through the first sealing gap 312.1 into the sealing fluid chamber 312.3. Furthermore, a continuous second flow 516.2 of purge medium is established through the second sealing gap 312.2 from the inner part 303.4 of the housing 303.1 into the sealing fluid chamber 312.3 as well. This continuous second flow 516.2 represents a purge medium barrier or sealing fluid barrier, respectively, that prevents intrusion of contaminants into the inner part 303.4 of the housing 303.1 via the second sealing gap 312.1.

Thus, massive, liquid or gaseous substances, in particular contaminants, are not only pre-vented from intruding into the inner part 303.4 of the housing 303.1 via the second sealing gap 312.2, they are also actively drawn off via the fluid channels 315.2.

It will be appreciated that, with such a solution that is actively drawing substances through the first sealing gap 312.1 into the sealing fluid chamber 312.3, it may be provided that either, e.g. by a suitable barrier means, immersion liquid is prevented from entering the first sealing gap 312.1, or the draw off mechanism is suitable for drawing off liquids.

Seventh Embodiment

Figure 11:
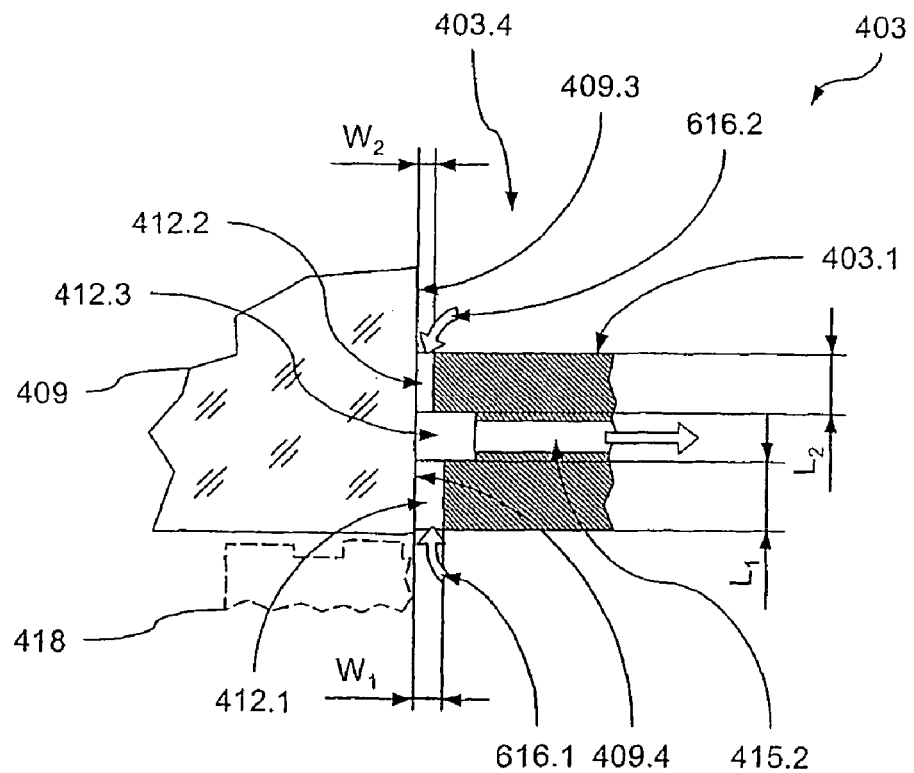
FIG. 11 is a schematic partial, representation of a further preferred embodiment of an optical element unit according to the present invention.

In the following, a seventh preferred embodiment of an optical element unit according to the present invention will be described with reference to FIG. 11. The optical element unit is identical to the optical element unit 403 of FIG. 9 such that identical reference numerals are used and reference is made to the above explanations in their context.

The only difference with respect to the fifth embodiment lies within the fact that, instead of supplying a sealing fluid to the sealing fluid chamber 412.3 and, thus, to the first sealing gap 412.1 and the second sealing gap 412.2, a negative pressure is provided to the fluid channels 415.2 via a suitable exhaust unit. This is done to such an extent that any medium or substance entering the sealing fluid chamber 412.3 is drawn off via the fluid channels 415.2. In other words, here as well, the fluid channels 415.2 then act as exhaust channels.

As a consequence, on the on hand, a continuous first flow 616.1 of a fraction of the atmosphere external to the housing 403.1 is established through the first sealing gap 412.1 into the sealing fluid chamber 412.3. Furthermore, a continuous second flow 616.2 of purge medium is established through the second sealing gap 412.2 from the inner part 403.4 of the housing 403.1 into the sealing fluid chamber 412.3 as well. This continuous second flow 516.2 represents a purge medium barrier or sealing fluid barrier, respectively, that prevents intrusion of contaminants into the inner part 403.4 of the housing 403.1 via the second sealing gap 412.1.

Thus, massive, liquid or gaseous substances, in particular contaminants, are not only pre-vented from intruding into the inner part 403.4 of the housing 403.1 via the second sealing gap 412.2, they are also actively drawn off via the fluid channels 415.2.

Eighth Embodiment

In the following, an eighth preferred embodiment of an optical element unit 703 according to the present invention will be described with reference to FIG. 12. The optical element unit 703 may replace the optical element unit 203 within the optical exposure apparatus 201 of FIG. 6.

Similar to the third embodiment, a last optical element 709 is held by a housing 703.1. The last optical element 709 is held by the housing 703.1 via first holding units—not shown—in the form of clamping units similar to the ones described above in the context of the third embodiment. In particular, the clamping units for the last optical element 709 comprise positioning devices as first adjustment units for adjusting the position of the last optical element 709 with respect to the housing 703.1 as it has been described above. Thus, in this context, it is here only referred to the above explanations.

The last optical element 709 is held by the housing 703.1 such that a narrow circumferential sealing gap 712 is formed and defined between the last optical element 709 and a sealing ring 703.9 of the housing 703.1 in a configuration similar to the one of FIG. 7. The sealing gap 712 extends in a circumferential direction along the circumference of the last optical element 709. The sealing gap 712 is bordered by a planar first wall element 709.3 of the last optical element 709 and a planar second wall element 703.6 of the sealing ring 703.9.

Figure 12:
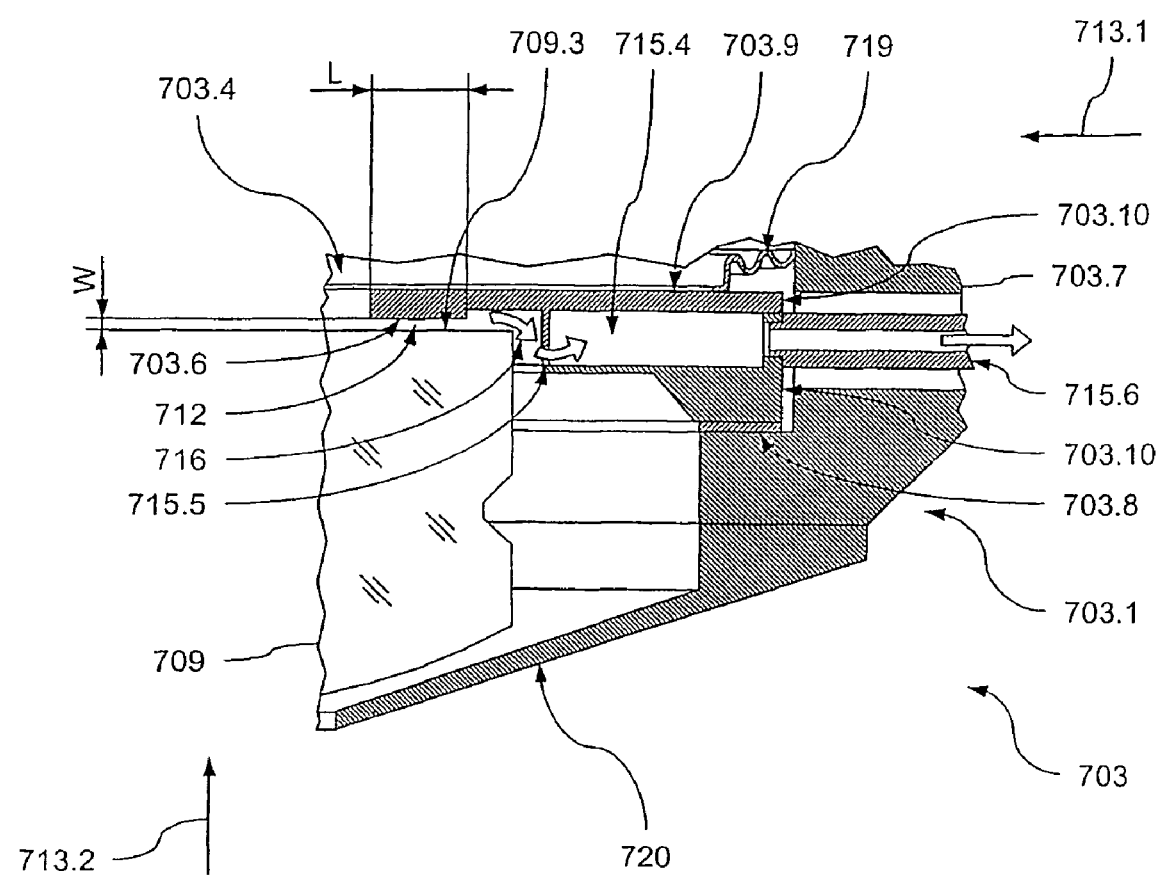
FIG. 12 is a schematic partial representation of a further preferred embodiment of an optical element unit according to the present invention.

In a first sectional plane perpendicular to said circumferential direction, i.e. in a plane coinciding with the plane of FIG. 12, the sealing gap 712 forms a passageway between the inner part 703.4 of the housing 703.1 and the environment external to the housing 703.1.

The sealing gap 712 has a sealing gap width W transverse to said passageway, i.e. in a second direction 713.2, and a sealing gap length L along said passageway, i.e. in a first direction 713.1. The sealing gap width W is defined by the distance between the last optical element 709 and the housing 703.1 in the region of the sealing gap 712.

The sealing gap length L is considerably higher than the sealing gap width W such that a narrow sealing gap 712 is formed. The sealing gap length L is in the order of a few millimeters while the sealing gap width W is in the order of a few micrometers up to a few dozens of micrometers. Preferably, the sealing gap length L ranges from 3 mm to 6 mm with an external diameter of the last optical element 709 of about 75 mm to 80 mm, while the sealing gap width W ranges from 5 μm to 70 μm. For example, the sealing gap width may be W=20 μm±10 μm. With such dimensions the sealing gap 712 provides sufficient clearance between the last optical element 709 and the housing 703.1 such that relative motions between the last optical element 709 and the housing 703.1 are possible.

The last optical element 709 is formed by a rotationally symmetric plane-convex lens. It mainly extends in a first plane and has a first axis of symmetry perpendicular to said first plane. In the eighth embodiment shown in FIG. 12, the first plane is perpendicular to the plane of the drawing; and the first axis of symmetry is coinciding with the optical axis 203.5 of the optical element group 207 when used in the optical exposure apparatus 201 of FIG. 6.

A second adjustment unit 703.8 is mounted between the support ring 703.7 of the housing 703.1 and a sealing ring 703.9 of the housing 703.1. The sealing ring 703.9 forms the second wall element 703.6 defining the sealing gap 712. The second adjustment unit 703.8 provides for positional adjustment of the sealing ring 703.9 in the direction of the optical axis 703.5 and in parallel to the first direction 713.1. Thus, it allows for adjustment of the sealing gap width W. This adjustment is independent of the positional adjustment of the last optical element 709 and may be selected exclusively according to the requirements for the sealing gap 712.

The adjustment mechanism of the adjustment unit 703.8 may be of any suitable design. It may be a passive mechanism such as simple spacers, a screw mechanism or the like or combinations thereof. It may also be an active mechanism such as a hydraulic actuator, an electric actuator or combinations thereof.

A sealing unit such as the sealing unit 215 of FIG. 6 is connected to the optical element unit 703 to supply a sealing fluid to the inner part 703.4 of the housing. The sealing fluid may be a purge medium a as it has been described above in the context of the first, second and third embodiment. The sealing fluid may be any suitable fluid, such as a liquid or a gas, preferably an inert gas.

The sealing unit comprises a sealing fluid source such as the sealing fluid source 215 of FIG. 6 connected to a sealing fluid distribution system—not shown—of the optical element unit 703 distributing the sealing fluid supplied by the sealing fluid source to different locations at the circumference of the last optical element 709 within the inner part 703.4 of the housing 703.1.

As a part of this sealing fluid distribution system a sealing fluid channel—not shown—discharging in the region of the sealing gap 712 at the inner circumference of the sealing ring 703.9 is provided within the housing 703.1 and connected to the sealing fluid source. This sealing fluid channel guides the sealing fluid or purge medium towards the sealing gap 712. Further sealing fluid channels similar to this sealing fluid channel are evenly distributed at the circumference of the last optical element 709. The purge medium is supplied by the purge medium source at such a quantity and such a pressure that a continuous flow 716 of purge medium is established, over the entire circumference of the last optical element 709, from the inner part 703.4 of the housing 703.1 through the first sealing gap 712.

This continuous first flow 716.1 represents a purge medium barrier or sealing fluid barrier, respectively, that prevents intrusion of contaminants into the inner part 703.4 of the housing 703.1 via the sealing gap 712. In particular, the continuous flow 716 prevents intrusion of substances into the inner part 703.4 of the housing 703.1 which might otherwise contaminate the optical elements of the optical element group or alter the optical characteristics in any other way.

The continuous flow 716.1 does not only prevent the intrusion of liquid or massive sub-stances into the inner part 703.4 of the housing 703.1. It also prevents the intrusion of gaseous substances into the inner part 703.4 of the housing 703.1 by dragging these along away from the sealing gap 712.

Due to the comparatively high sealing gap length L and the small sealing gap width W the sealing gap 712 also forms a restrictor element leading to a comparatively low flow rate of the continuous flow 716. In other words, the sealing function is achieved with a comparatively low flow volume of the purge medium exiting from the first sealing gap 712. This is advantageous since, thus, the losses of purge medium, which usually is comparatively expensive, may be kept low.

To prevent that this continuous flow 716 of purge medium produces a disturbing flow situation at the exterior of the housing, e.g. at the lower surface of the last optical element 709, the exhaust unit 215.3 of FIG. 6, via a flexible exhaust line 715.6, is connected to an exhaust channel 715.4 provided within the sealing ring 703.9 of the housing 703.1. The exhaust channel 715.4 has a plurality of inlets 715.5 evenly distributed at the circumference of the last optical element 709. The inlets 715.5 are associated to the sealing gap 712.

The channel 715.4 is formed between a lower first shell 703.10 and an upper second shell 703.11 sitting thereon. The first shell 703.10 and the second shell 703.11 form the sealing ring 703.9. The first shell 703.10 and the second shell 703.11 may be easily manufactured by suitable processes. In particular, the second wall element 703.6 of the second shell 703.11 bordering the sealing gap 712 may be easily manufactured at a sufficient accuracy and surface quality. For example, it may be manufactured by a suitable high precision grinding or turning process.

Further exhaust lines similar to exhaust line 715.6 are evenly distributed at the outer circumference of the sealing ring 703.9. Via the channel 715.4 and these exhaust lines 715.4, the exhaust unit 215.3 draws off gaseous substances and, thus, the continuous flow 716, preventing the latter from developing the disturbing effects mentioned above. To this end, in particular, the exhaust unit 215.3 may be dimensioned such that, a flow greater than the continuous flow 716 is drawn off.

As can be seen from FIG. 12, a flexible sealing device 719 is provided between the sealing ring 703.9 and the support ring 703.7 to provide proper sealing of the interior part 703.4 of the housing 703.1 and positional adjustability of the sealing ring 703.9. The flexible sealing device 719 may be of any suitable type, e.g. a membrane or the like. It may be connected to the sealing ring 703.9 and the support ring 703.7 by any suitable means, e.g. by an adhesive, screws, clamping means etc.

As can be seen from FIG. 12 as well, a protection cap 720 is connected to the support ring 703.7 to protect the whole adjustment and sealing mechanism previously described.

Here as well, it will be appreciated that, with other embodiments of the invention, any other suitable orientation of the first and second wall element bordering the sealing gap may be chosen with respect to the first axis of symmetry of the last optical element. In particular, the first and second wall element may have any other inclination with respect to each other as well as with respect to the first axis of symmetry of the last optical element. Furthermore, again, the respective sealing gap may also be bordered by a plurality of wall elements having different inclinations with respect to the first axis of symmetry of the last optical element.

It will be further appreciated that, with other embodiments of the present invention, more than two consecutive sealing gaps may be provided. In particular, sealing gap configurations as described above in the context of the first to seventh embodiment may be arbitrarily combined.

In the foregoing, the invention has been described only in the context of applications where at least one sealing gap is formed between the optically active part, e.g. the transmissive part, of the last optical element and a housing. Anyway, it will be appreciated that the sealing gap may also be formed between an optically inactive part of the last optical element, e.g. a non-transmissive element connected to the transmissive part of the last optical element in a fluid tight manner and held together as the last optical element, and a housing element. Such an optically inactive element may, for example, be a ring shaped element having substantially the same coefficient of thermal present invention may be used in the context of any other imaging process using immersion techniques.

Furthermore, in the foregoing, the invention has been described only in the context of rotationally symmetric ultimate optical elements. Anyway, it will be appreciated that the invention may also be used in the context of any other non-rotationally symmetric shape of the ultimate optical element. Thus, for example, the ultimate optical element may have an at least partly arbitrarily curved and/or an at least partly polygonal shape in its plane of main extension.

Furthermore, in the foregoing, the invention has been described only in the context of last optical elements. Anyway, it will be appreciated that the invention may also be used in the context of first optical elements located at an entry end of an optical system held within a corresponding housing. It will also be appreciated that the housing mentioned above does not necessarily have to be spatially separated from another housing. Rather, the invention may also be used in the context any other optical elements separating a first space internal to a first housing or housing part from a second space external to said housing or housing part. It will be appreciated that this second space itself may again be internal to another housing or housing part.

Finally, in the foregoing, the invention has been described only in the context of microlithography applications. Anyway, it will be appreciated that the present invention may be used in the context of any other imaging process using immersion techniques or not.

The invention claimed is:

1. An optical element unit comprising:
   an optical element group;
   a housing receiving said optical element group and having an inner housing part and an exit end; and
   a purge unit connected to said housing and providing a purge medium to said inner housing part; wherein
   said optical element group comprises an ultimate optical element;
   said ultimate optical element is located at said exit end of said housing and separates said inner housing part from an environment external to said housing;
   said ultimate optical element and said housing adjustably define a sealing gap;
   said purge unit provides said purge medium to said sealing gap to prevent intrusion of contaminants into said inner housing part.

2. The optical element unit according to claim 1, wherein said sealing gap is a narrow gap.

3. The optical element unit according to claim 1, wherein said sealing gap has a circumferential extension in a circumferential direction along a circumference of said ultimate optical element;
   said sealing gap, in a first sectional plane perpendicular to said circumferential direction, forms a passageway between said inner housing part and said environment external to said housing;
   said sealing gap has a sealing gap length along said passageway and a sealing gap width transverse to said passageway;
   said sealing gap width being smaller than said sealing gap length.

4. The optical element unit according to claim 3, wherein said sealing gap width ranges from 5 μm to 20 μm.

5. The optical element unit according to claim 3, wherein said sealing gap length ranges from 3 mm to 6 mm.

6. The optical element unit according to claim 1, wherein said ultimate optical element has a first wall bordering said sealing gap and said housing has a second wall bordering said sealing gap;
   at least one of said first wall and said second wall is coated with a repellent coating,
   said repellent coating being repellent to an immersion medium said ultimate optical element is to be immersed in.

7. The optical element unit according to claim 6, wherein said repellent coating is a hydrophobic coating.

8. The optical element unit according to claim 6, wherein said repellent coating comprises a Polytetrafluorethylene (PTFE).

9. The optical element unit according to claim 1, wherein said ultimate optical element mainly extends in a first plane and has a first axis of symmetry perpendicular to said first plane.

10. The optical element unit according to claim 9, wherein said ultimate optical element forms a first wall section bordering said sealing gap, at least a part of said first wall section extending parallel to said first axis of symmetry and/or
    said ultimate optical element forms a second wall section bordering said sealing gap, at least a part of said second wall section being inclined to said first axis of symmetry.

11. The optical element unit according to claim 10, wherein at least a part of said first wall is essentially perpendicular to said first axis of symmetry.

12. The optical element unit according to claim 1, wherein said ultimate optical element and said housing adjustably define a further sealing gap.

13. The optical element unit according to claim 1, wherein said purge unit is maintaining a purge medium barrier of said purge medium within said sealing gap preventing intrusion of contaminants into said inner housing part.

14. The optical element unit according to claim 1, wherein said purge unit is generating a flow of said purge medium through said sealing gap towards said environment exterior to said housing.

15. The optical element unit according to claim 1, wherein said purge unit comprises at least one purge medium channel guiding said purge medium towards said sealing gap.

16. The optical element unit according to claim 15, wherein said purge medium channel is at least partially formed within said housing.

17. The optical element unit according to claim 1, wherein said purge medium is a liquid.

18. The optical element unit according to claim 1, wherein said purge medium is a gas.

19. The optical element unit according to claim 1, wherein said purge unit comprises a first exhaust unit drawing off contaminants intruded into said inner housing part via said sealing gap.

20. The optical element unit according to claim 19, wherein
said first exhaust unit comprises at least one exhaust channel having an inlet portion;
said inlet portion of said exhaust channel being associated to said sealing gap.

21. The optical element unit according to claim 1, wherein said housing comprises at least a first holding element holding said ultimate optical element.

22. The optical element unit according to claim 21, wherein said first holding element is clamping said ultimate optical element.

23. The optical element unit according to claim 22, wherein
said ultimate optical element mainly extends in a first plane and has a first axis of symmetry perpendicular to said first plane;
said first holding element is exerting a first clamping force on said ultimate optical element,
said first clamping force being directed essentially towards said first axis of symmetry and being essentially parallel to said first plane.

24. The optical element unit according to claim 21, wherein
said ultimate optical element mainly extends in a first plane and has a first axis of symmetry perpendicular to said first plane;
said first holding element is arranged to be resilient along a first direction,
said first direction being directed essentially towards said first axis of symmetry and being essentially parallel to said first plane.

25. The optical element unit according to claim 24, wherein
said first holding element is arranged to show a high degree of rigidity in a second direction,
said second direction being essentially parallel to first axis of symmetry.

26. The optical element unit according to claim 21, wherein said first holding element comprises a positioning device for adjusting the position of said ultimate optical element with respect to said housing.

27. The optical element unit according to claim 1, wherein a positioning device provided, said positioning device adjusting a sealing gap width of said sealing gap, said sealing gap width being defined by the distance between said ultimate optical element and a part of said housing.

28. An optical exposure apparatus for transferring an image of a pattern formed on a mask onto a substrate comprising:
a light path;
a mask location located within said light path and receiving said mask;
a substrate location located at an end of said light path and receiving said substrate;
an optical element unit according to claim 1 located within said light path between said mask location and said and said substrate location;
an immersion zone filled with an immersion medium and located within said light path between said optical element unit and said substrate location; wherein:
said ultimate optical element separates said inner housing part from said immersion zone;
said purge unit provides said purge medium to said sealing gap to prevent intrusion of said immersion medium through said sealing gap into said inner housing part.

29. The optical exposure apparatus according to claim 28, wherein
said ultimate optical element has a first wall bordering said sealing gap and said housing has a second wall bordering said sealing gap;
at least one of said first wall and said second wall is coated with a repellent coating,
said repellent coating being repellent to said immersion medium.

30. The optical exposure apparatus according to claim 28, wherein said purge unit is maintaining a purge medium barrier of said purge medium within said sealing gap preventing intrusion of said immersion medium into said inner housing part.

31. The optical exposure apparatus according to claim 28, wherein said purge unit is generating a flow of said purge medium through said sealing gap towards said immersion zone.

32. The optical exposure apparatus according to claim 28, wherein said purge unit comprises a first exhaust unit drawing off fractions of said immersion medium or reaction products thereof intruding into said inner housing part via said sealing gap.

33. An optical element unit comprising:
an optical element; and
a housing having an inner housing part and an exit end;
said housing holding said optical element at said exit end to separate said inner housing part from an environment external to said housing;
said optical element and said housing adjustably defining a sealing gap adapted to receive a sealing fluid barrier preventing intrusion of contaminants into said inner housing part.

34. The optical element unit according to claim 33, wherein
said sealing gap has a circumferential extension in a circumferential direction along a circumference of said optical element;
said sealing gap, in a first sectional plane perpendicular to said circumferential direction, forms a passageway between said inner housing part and said environment external to said housing;
said sealing gap has a sealing gap length along said passageway and a sealing gap width transverse to said passageway;
said sealing gap width being smaller than said sealing gap length.

35. The optical element unit according to claim 34, wherein said sealing gap width ranges from 5 μm to 20 μm.

36. The optical element unit according to claim 34, wherein said sealing gap length ranges from 3 mm to 6 mm.

37. The optical element unit according to claim 33, wherein
said optical element has a first wall bordering said sealing gap and said housing has a second wall bordering said sealing gap;
at least one of said first wall and said second wall is coated with a repellent coating,
said repellent coating being repellent to an immersion medium said optical element is to be immersed in.

38. The optical element unit according to claim 33, wherein said ultimate optical element mainly extends in a first plane and has a first axis of symmetry perpendicular to said first plane.

39. The optical element unit according to claim 33, wherein a sealing barrier unit is provided, said sealing barrier unit maintaining said sealing fluid barrier within said sealing gap.

40. The optical element unit according to claim 39, wherein said sealing barrier unit is generating a flow of a sealing fluid through said sealing gap towards said environment exterior to said housing, said sealing fluid forming said sealing fluid barrier.

41. The optical element unit according to claim 39, wherein said sealing barrier unit comprises at least one sealing fluid channel guiding a sealing fluid towards said sealing gap, said sealing fluid forming said sealing fluid barrier.

42. The optical element unit according to claim 41, wherein said sealing fluid channel is at least partially formed within said housing.

43. The optical element unit according to claim 33, wherein a liquid or a gas is provided as a sealing fluid forming said sealing fluid barrier.

44. The optical element unit according to claim 39, wherein said sealing barrier unit comprises a first exhaust unit drawing off contaminants intruded into said inner housing part via said sealing gap.

45. The optical element unit according to claim 33, wherein said housing comprises at least a first holding element holding said optical element.

46. The optical element unit according to claim 45, wherein said first holding element is clamping said optical element.

47. The optical element unit according to claim 45, wherein a positioning device is provided, said positioning device adjusting said sealing gap by adjusting the position of said optical element with respect to a part of said housing.

48. An optical exposure apparatus for transferring an image of a pattern formed on a mask onto a substrate comprising:
   a light path;
   a mask location located within said light path and receiving said mask;
   a substrate location located at an end of said light path and receiving said substrate;
   an optical element unit according to claim 33 located within said light path between said mask location and said and said substrate location;
   an immersion zone filled with an immersion medium and located within said light path between said optical element unit and said substrate location; wherein:
   said optical element separates said inner housing part from said immersion zone;
   said sealing fluid barrier is maintained within said sealing gap to prevent intrusion of said immersion medium through said sealing gap into said inner housing part.

49. The optical exposure apparatus according to claim 48, wherein
   said optical element has a first wall bordering said sealing gap and said housing has a second wall bordering said sealing gap;
   at least one of said first wall and said second wall is coated with a repellent coating,
   said repellent coating being repellent to said immersion medium.

50. The optical exposure apparatus according to claim 48, wherein a sealing barrier unit is provided, said sealing barrier unit maintaining said sealing fluid barrier within said sealing gap preventing intrusion of said immersion medium into said inner housing part.

51. The optical exposure apparatus according to claim 50, wherein said sealing barrier unit is generating a flow of a sealing fluid through said sealing gap towards said immersion zone, said sealing fluid forming said sealing fluid barrier.

52. The optical exposure apparatus according to claim 48, wherein said sealing barrier unit comprises a first exhaust unit drawing off fractions of said immersion medium or reaction products thereof intruding into said inner housing part via said sealing gap.

53. An optical element unit comprising:
   an optical element; and
   a housing having an inner housing part and an exit end; wherein
   said housing holds said optical element at said exit end to separate said inner housing part from an immersion zone filled with an immersion medium said exit end is to be immersed in;
   said optical element and said housing adjustably define a narrow sealing gap, said sealing gap being open towards said immersion zone and said inner housing part.

54. The optical element unit according to claim 53, wherein
   said sealing gap has a circumferential extension in a circumferential direction along a circumference of said optical element;
   said sealing gap, in a first sectional plane perpendicular to said circumferential direction, forms a passageway between said inner housing part and said immersion zone;
   said sealing gap has a sealing gap length along said passageway and a sealing gap width transverse to said passageway;
   said sealing gap width being smaller than said sealing gap length.

55. The optical element unit according to claim 54, wherein said sealing gap width ranges from 5 µm to 20 µm.

56. The optical element unit according to claim 54, wherein said sealing gap length ranges from 3 mm to 6 mm.

57. The optical element unit according to claim 53, wherein said housing comprises at least a first holding element holding said optical element.

58. The optical element unit according to claim 57, wherein said first holding element is clamping said optical element.

59. The optical element unit according to claim 58, wherein
   said optical element mainly extends in a first plane and has a first axis of symmetry perpendicular to said first plane;
   said first holding element is exerting a first clamping force on said optical element,
   said first clamping force being directed essentially towards said first axis of symmetry and being essentially parallel to said first plane.

60. The optical element unit according to claim 57, wherein
   said optical element mainly extends in a first plane and has a first axis of symmetry perpendicular to said first plane;
   said first holding element is arranged to be resilient along a first direction,
   said first direction being directed essentially towards said first axis of symmetry and being essentially parallel to said first plane.

61. The optical element unit according to claim 60, wherein
   said first holding element is arranged to show a high degree of rigidity in a second direction,
   said second direction being essentially parallel to first axis of symmetry.

62. The optical element unit according to claim 53, wherein a positioning device is provided, said positioning device adjusting said sealing gap by adjusting the position of said optical element with respect to a part of said housing.

63. The optical element unit according to claim 53, wherein a sealing barrier is provided within said sealing gap to prevent intrusion of contaminants through said sealing gap into said inner housing part.

64. An optical exposure apparatus for transferring an image of a pattern formed on a mask onto a substrate comprising:
  a light path;
  a mask location located within said light path and receiving said mask;
  a substrate location located at an end of said light path and receiving said substrate;
  an optical element unit according to claim 53 located within said light path between said mask location and said and said substrate location;
  an immersion zone filled with an immersion medium and located within said light path between said optical element unit and said substrate location; wherein
  said optical element is immersed within said immersion medium of said immersion zone.

65. A method of preventing intrusion of contaminants into an optical element unit comprising:
  providing an optical element unit, said optical element unit comprising a housing having an inner housing part and an exit end,
  providing an optical element at said exit end to separate said inner housing part from an environment external to said housing, said optical element and said housing adjustably defining a sealing gap
  providing a sealing fluid barrier within said sealing gap preventing intrusion of contaminants into said inner housing part.

66. The method according to claim 65, wherein
  said sealing gap has a circumferential extension in a circumferential direction along a circumference of said optical element;
  said sealing gap, in a first sectional plane perpendicular to said circumferential direction, forms a passageway between said inner housing part and said environment external to said housing;
  said sealing gap has a sealing gap length along said passageway and a sealing gap width transverse to said passageway;
  said sealing gap width being smaller than said sealing gap length.

67. The method according to claim 66, wherein said sealing gap width ranges from 5 µm to 20 µm.

68. The method according to claim 66, wherein said sealing gap length ranges from 3 mm to 6 mm.

69. The method according to claim 65, wherein
  said optical element is provided with a first wall bordering said sealing gap and said housing is provided with a second wall bordering said sealing gap;
  at least one of said first wall and said second wall is coated with a repellent coating,
  said repellent coating being repellent to an immersion medium said optical element is to be immersed in.

70. The method according to claim 65, wherein said providing of said sealing fluid barrier comprises generating a flow of a sealing fluid through said sealing gap towards said environment exterior to said housing.

71. The method according to claim 65, wherein a liquid or a gas is provided to said sealing gap as a sealing fluid forming said sealing fluid barrier.

72. The method according to claim 65, wherein contaminants intruding into said inner housing part via said sealing gap are drawn off from a location adjacent said sealing gap.

73. A method of holding a ultimate optical element of an optical element unit to separate an inner part of said optical element unit from an immersion zone filled with an immersion medium said optical element is to be at least partly immersed in, comprising:
  providing said optical element unit, said optical element unit comprising a housing having an inner housing part and an exit end,
  holding said optical element at said exit end to separate said inner housing part from said immersion medium;
  said optical element being held such that said optical element and said housing adjustably define a narrow sealing gap, said sealing gap being open towards said immersion zone and said inner housing part.

74. The method according to claim 73, wherein
  said sealing gap has a circumferential extension in a circumferential direction along a circumference of said optical element;
  said sealing gap, in a first sectional plane perpendicular to said circumferential direction, forms a passageway between said inner housing part and said immersion zone;
  said sealing gap has a sealing gap length along said passageway and a sealing gap width transverse to said passageway;
  said sealing gap width being smaller than said sealing gap length.

75. The method according to claim 74, wherein said sealing gap width ranges from 5 µm to 20 µm.

76. The method according to claim 74, wherein said sealing gap length ranges from 3 mm to 6 mm.

77. The method according to claim 73, wherein said holding said ultimate optical element comprises clamping said ultimate optical element.

78. The method according to claim 77, wherein
  said ultimate optical element mainly extends in a first plane and has a first axis of symmetry perpendicular to said first plane;
  said clamping said ultimate optical element comprises exerting a first clamping force on said optical element,
  said first clamping force being directed essentially towards said first axis of symmetry and being essentially parallel to said first plane.

79. The method according to claim 73, wherein
  said optical element mainly extends in a first plane and has a first axis of symmetry perpendicular to said first plane;
  said holding said ultimate optical element comprises holding said ultimate optical element resiliently along a first direction,
  said first direction being directed essentially towards said first axis of symmetry and being essentially parallel to said first plane.

80. The method according to claim 79, wherein
  said holding said ultimate optical element comprises holding said ultimate optical element with a degree of rigidity in a second direction,
  said second direction being essentially parallel to first axis of symmetry.

81. The method according to claim 73, wherein said the position of said ultimate optical element with respect to said housing is adjusted.

82. The method according to claim 73, wherein a sealing barrier is provided within said sealing gap to prevent intrusion of contaminants through said sealing gap into said inner housing part.

* * * * *